(12) United States Patent
Huang

(10) Patent No.: US 12,131,945 B2
(45) Date of Patent: Oct. 29, 2024

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventor: Yu-Lien Huang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 373 days.

(21) Appl. No.: 17/580,725

(22) Filed: Jan. 21, 2022

(65) Prior Publication Data

US 2023/0238279 A1  Jul. 27, 2023

(51) Int. Cl.
*H01L 21/768* (2006.01)
*H01L 29/66* (2006.01)
*H01L 29/78* (2006.01)

(52) U.S. Cl.
CPC .. *H01L 21/76877* (2013.01); *H01L 21/76802* (2013.01); *H01L 21/76831* (2013.01); *H01L 29/66795* (2013.01); *H01L 29/7851* (2013.01)

(58) Field of Classification Search
CPC ......... H01L 21/76877; H01L 21/76802; H01L 21/76831; H01L 21/76834; H01L 21/76897; H01L 21/76883; H01L 29/66795; H01L 29/7851; H01L 29/41791; H01L 29/785
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,243,053 B1* | 3/2019 | Xie | H01L 29/785 |
| 10,573,753 B1* | 2/2020 | Zang | H01L 21/76832 |
| 2018/0342420 A1* | 11/2018 | You | H01L 21/76843 |
| 2019/0333820 A1* | 10/2019 | Chang | H01L 21/76843 |
| 2020/0058785 A1* | 2/2020 | Tsai | H01L 29/41791 |
| 2020/0135912 A1* | 4/2020 | Tsai | H01L 21/02362 |

(Continued)

*Primary Examiner* — Bac H Au
(74) *Attorney, Agent, or Firm* — Birch, Stewart, Kolasch & Birch, LLP

(57) ABSTRACT

The method for forming a semiconductor device includes forming a gate structure over a substrate; forming a plurality of source/drain structures in the substrate and on opposite sides of the gate structure; forming a source/drain contact on one of the plurality of source/drain structures; etching back the source/drain contact; forming a protective structure over the etched back source/drain contact; forming a dielectric layer over the gate structure and the protective structure; etching the dielectric layer to form an opening that exposes the gate structure and the protective structure; selectively depositing a capping material on the protective structure; after selectively depositing the capping material, forming a gate contact in the opening.

20 Claims, 26 Drawing Sheets

(56) References Cited

U.S. PATENT DOCUMENTS

| | | | |
|---|---|---|---|
| 2020/0243385 A1* | 7/2020 | Huang | H01L 21/76877 |
| 2020/0365697 A1* | 11/2020 | Li | H01L 29/6653 |
| 2021/0083046 A1* | 3/2021 | Lin | H01L 21/76897 |
| 2021/0134969 A1* | 5/2021 | Huang | H01L 29/66515 |
| 2021/0202744 A1* | 7/2021 | You | H01L 29/4966 |
| 2021/0225766 A1* | 7/2021 | You | H01L 21/76877 |
| 2021/0391431 A1* | 12/2021 | Huang | H01L 29/41791 |
| 2022/0277994 A1* | 9/2022 | Lai | H01L 29/66545 |
| 2022/0293742 A1* | 9/2022 | Tsai | H01L 29/45 |

* cited by examiner

M1

SEMICONDUCTOR DEVICE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
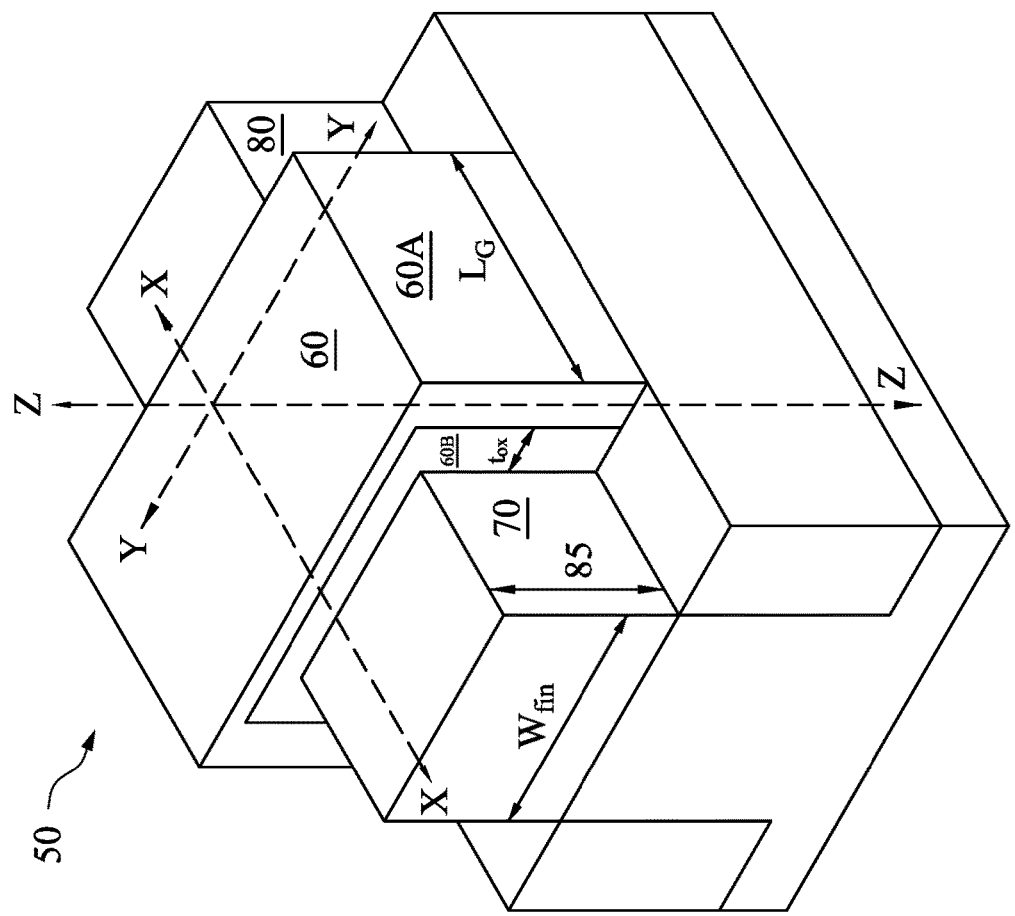
FIG. 1A is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present disclosure are directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. The double-patterning or the multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In order to define self-aligned gate contact region, a dielectric cap may be formed on the source/drain contact. However, the etching process for forming a gate contact opening in a subsequent process may consume the dielectric cap, and thus the dielectric cap may be damaged to a thinner thickness and may not be thick enough to suppress a leakage current. That is, if the gate contact formed subsequently in the opening directly lands on the thinner dielectric cap, a leakage current may occur to flow between the source/drain contact and the gate contact through the thinner dielectric cap, which in turn reduces the yield of the semiconductor device.

Therefore, the present disclosure in various embodiments provides a selective deposition process for forming a capping material over the thinned dielectric cap that is exposed in the gate contact opening. An advantage is that the capping material atop the thinned dielectric cap may be formed to increase a distance between the source/drain contact and the gate contact formed in the gate contact opening, which in turn prevents a leakage current from flowing between the source/drain contact and the gate contact, and thus the yield of the semiconductor device can be improved.

FIG. 1A is a perspective view of an example FinFET device. The use of FinFET devices has been gaining popularity in the semiconductor industry. Referring to FIG. 1A, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1A. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

Figure 1B:
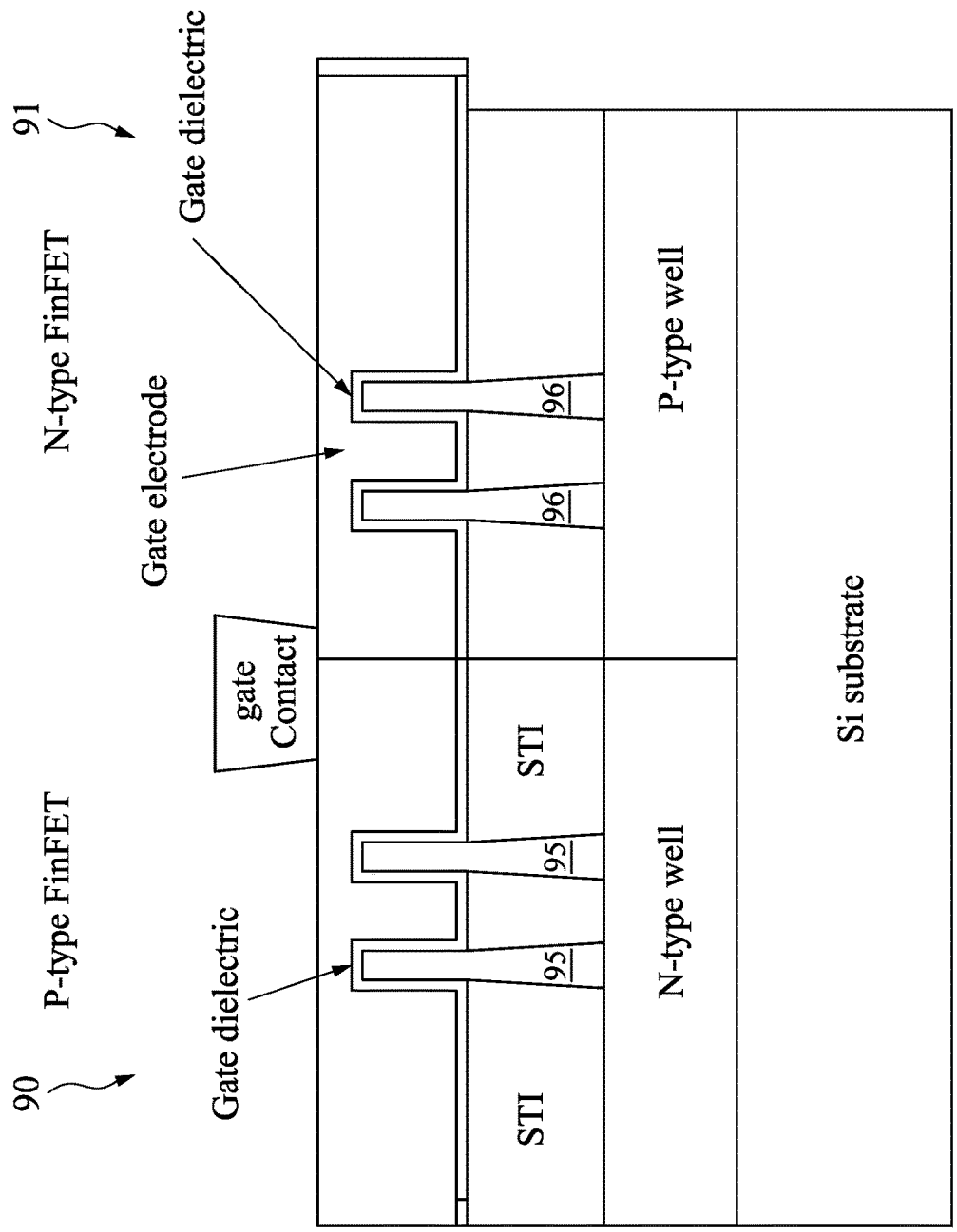
FIG. 1B is a diagrammatic cross-sectional side view of FinFET transistors in a CMOS configuration.

FIG. 1B illustrates a diagrammatic cross-sectional side view of FinFET transistors in a CMOS configuration. The CMOS FinFET includes a substrate, for example a silicon substrate. An N-type well and a P-type well are formed in the substrate. A dielectric isolation structure such as a shallow trench isolation (STI) is formed over the N-type well and the P-type well. A P-type FinFET 90 is formed over the N-type well, and an N-type FinFET 91 is formed over the P-type well. The P-type FinFET 90 includes fins 95 that protrude upwardly out of the STI, and the N-type FinFET 91 includes fins 96 that protrude upwardly out of the STI. The fins 95 include the channel regions of the P-type FinFET 90, and the fins 96 include the channel regions of the N-type FinFET 91. In some embodiments, the fins 95 are comprised of silicon germanium, and the fins 96 are comprised of silicon. A gate dielectric is formed over the fins 95-96 and over the STI, and a gate electrode is formed over the gate dielectric. In some embodiments, the gate dielectric includes a high-k dielectric material, and the gate electrode includes a metal gate electrode, such as aluminum and/or other refractory metals. In some other embodiments, the gate dielectric may include SiON, and the gate electrode may include polysilicon. A gate contact is formed on the gate electrode to provide electrical connectivity to the gate.

Figure 2A:
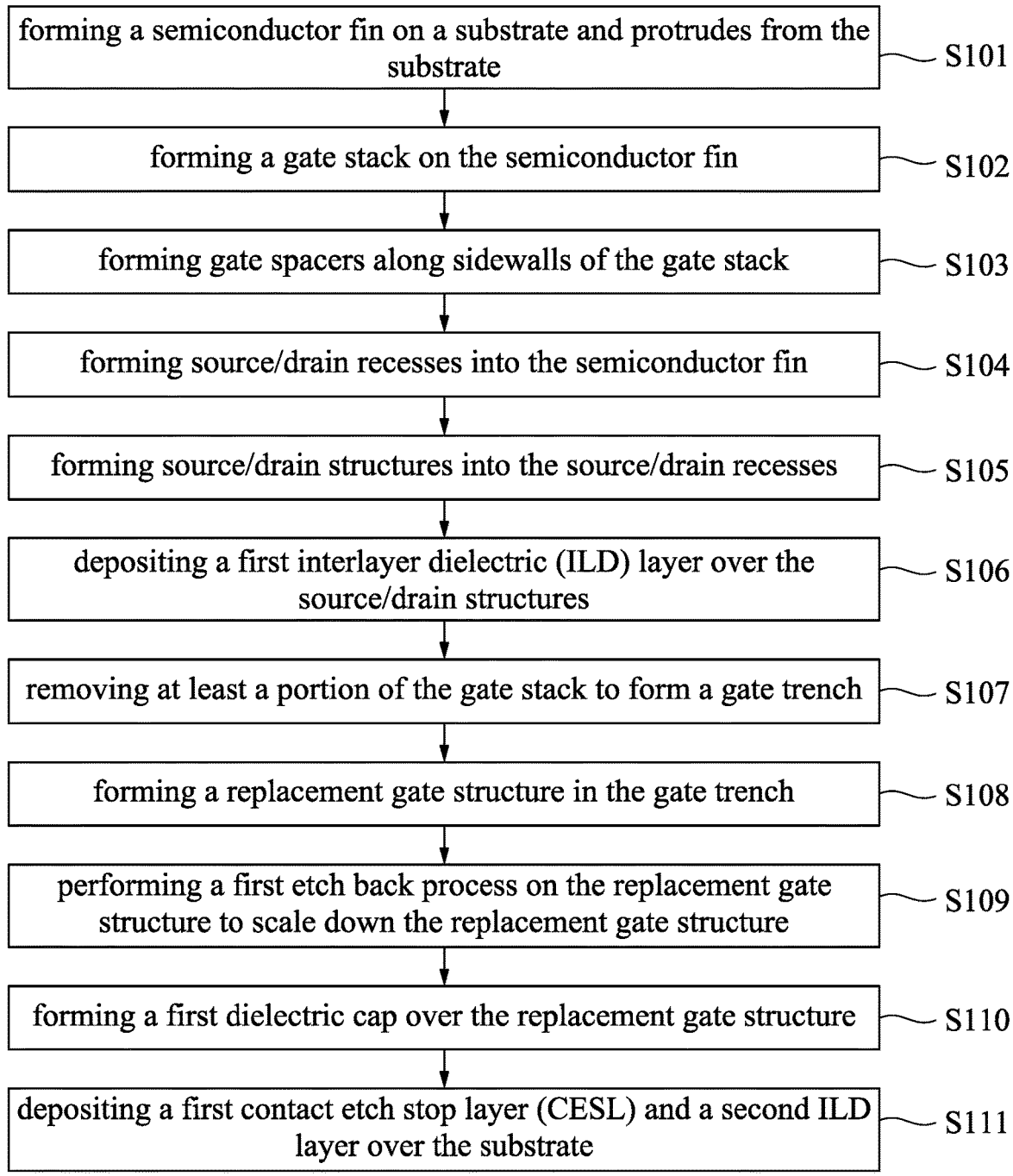
FIGS. 2A and 2B are a flowchart of a method for forming a semiconductor device in accordance with some embodiments of the present disclosure.
Figure 2B:

Referring now to FIGS. 2A and 2B, illustrated is a flowchart of an exemplary method M for fabrication of a semiconductor device 100 in accordance with some embodiments. The method M includes a relevant part of the entire manufacturing process. It is understood that additional operations may be provided before, during, and after the operations shown by FIGS. 2A and 2B, and some of the operations described below can be replaced or eliminated for additional embodiments of the method. The order of the operations/processes may be interchangeable. The method M includes fabrication of a semiconductor device 100. However, the fabrication of the semiconductor device 100 is merely an example for describing the manufacturing process according to some embodiments of the present disclosure.

Figure 3:
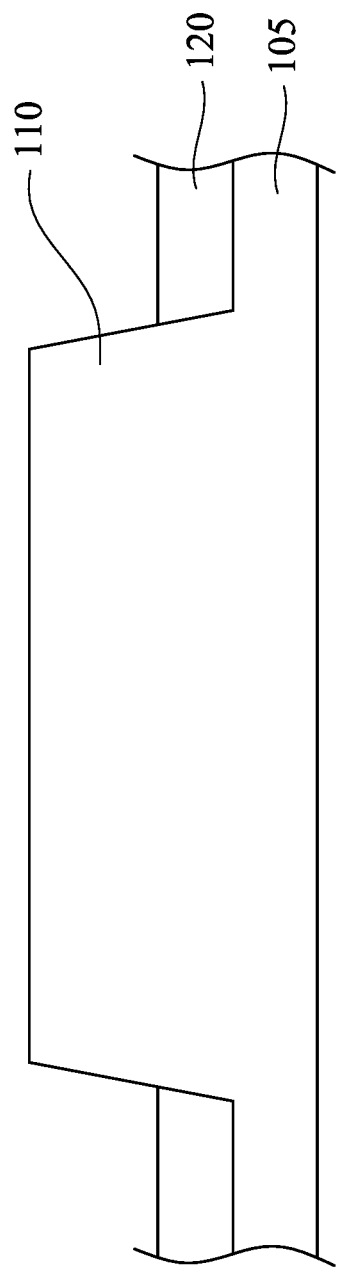
FIGS. 3 to 24 illustrate a method in various stages of forming a semiconductor device in accordance with some embodiments of the present disclosure.

FIGS. 3-24 illustrate the method M in various stages of forming a semiconductor device 100 in accordance with some embodiments of the present disclosure. The method M begins at block S101. Referring to FIG. 3, in some embodiments of block S101, a semiconductor fin is formed on a substrate and protrudes from the substrate. In some embodiments, the substrate 105 includes silicon. Alternatively, the substrate 105 may include germanium, silicon germanium, gallium arsenide or other appropriate semiconductor materials. Also alternatively, the substrate 105 may include an epitaxial layer. For example, the substrate 105 may have an epitaxial layer overlying a bulk semiconductor. Further, the substrate 105 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such a strained substrate may be formed by selective epitaxial growth (SEG). Furthermore, the substrate 105 may include a semiconductor-on-insulator (SOI) structure. Also alternatively, the substrate 105 may include a buried dielectric layer, such as a buried oxide (BOX) layer, such as that formed by separation by implantation of oxygen (SIMOX) technology, wafer bonding, SEG, or another appropriate method.

In some embodiments, the semiconductor fin 110 includes silicon. The semiconductor fin 110 may be formed, for example, by patterning and etching the substrate 105 using photolithography techniques. In some embodiments, a layer of photoresist material (not shown) is sequentially deposited over the substrate 105. The layer of photoresist material is irradiated (exposed) in accordance with a desired pattern (the semiconductor fin 110 in this case) and developed to remove portions of the photoresist material. The remaining photoresist material protects the underlying material from subsequent processing steps, such as etching. It is noted that other masks, such as an oxide or silicon nitride mask, may also be used in the etching process.

An isolation dielectric 120 is formed to fill trenches between the semiconductor fins 110 to serve as shallow trench isolation (STI). The isolation dielectric 120 may include any suitable dielectric material, such as silicon oxide. The method of forming the isolation dielectric 120 may include depositing an isolation dielectric 120 on the substrate 105 to cover the semiconductor fin 110, optionally performing a planarization process, such as a chemical mechanical polishing (CMP) process, to remove the excess isolation dielectric 120 outside the trenches, and then performing an etching process on the isolation dielectric 120 until upper portions of the semiconductor fins 110 are exposed. In some embodiments, the etching process performed may be a wet etching process, such as that in which the substrate 105 is dipped in hydrofluoric acid (HF). In alternative embodiments, the etching process may be a dry etching process. For example, the dry etching process may be performed using $HF/NH_3$ or $NF_3/NH_3$ as the etching gas.

Figure 4:
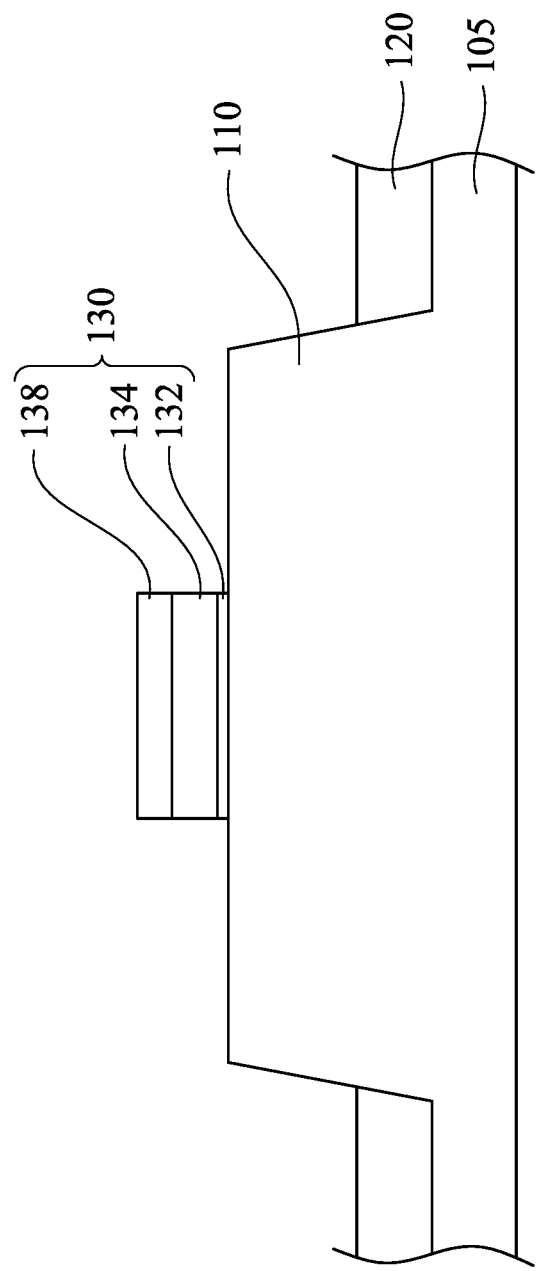

Referring back to FIG. 2A, the method M then proceeds to block S102 where a gate stack is formed on the semiconductor fin. With reference to FIG. 4, in some embodiments of block S102, a gate stack 130 is formed on portions of the semiconductor fin 110, such that other portions of the semiconductor fin 110 are exposed. In some embodiments using a gate-last process, the gate stack 130 is dummy gate and at least portions thereof will be replaced by final gate stack at a subsequent stage. For example, portions of the gate stack 130 may be replaced at a subsequent stage by metal gate electrode (MG) after high temperature thermal processes, such as thermal annealing for source/drain activation during the formation of sources/drains.

In some embodiments, the gate stack 130 may include a gate dielectric 132, a dummy electrode 134, and a gate mask 138. In some embodiments, the gate dielectric 132 includes silicon oxide. In alternative embodiments, the gate dielectric 132 may have a multilayer structure such as one layer of silicon oxide (e.g., interfacial layer) and another layer of high-k material. The dummy electrode 134 may include polycrystalline silicon (polysilicon), as an example. The gate masks 138 may include a suitable dielectric material, such as silicon nitride, silicon oxynitride or silicon carbide, as examples. In some embodiments, the gate mask 138 may have a material different than the dummy electrode 134. The gate stack 130 can be formed by deposition and patterning. For example, the gate dielectric 132 is blanket deposited on the structure shown in FIG. 3 by a suitable technique, such as chemical vapor deposition (CVD). The dummy electrode 134 is deposited on the gate dielectric 132 by a suitable technique, such as CVD. The gate mask 138 is deposited on the dummy electrode 134 by a suitable technique, such as CVD. Next, the gate mask 138 is patterned by a lithography process and an etching process, thereby forming openings in the gate mask 138, and exposing the underlying dielectric capping materials within the openings. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). Another etching process is applied to the dielectric capping materials and dummy gate materials through the openings of the gate mask 138 using the gate mask 138 as an etch mask, thereby forming the gate stack 130 straddling portions of the semiconductor fin 110.

Figure 5:
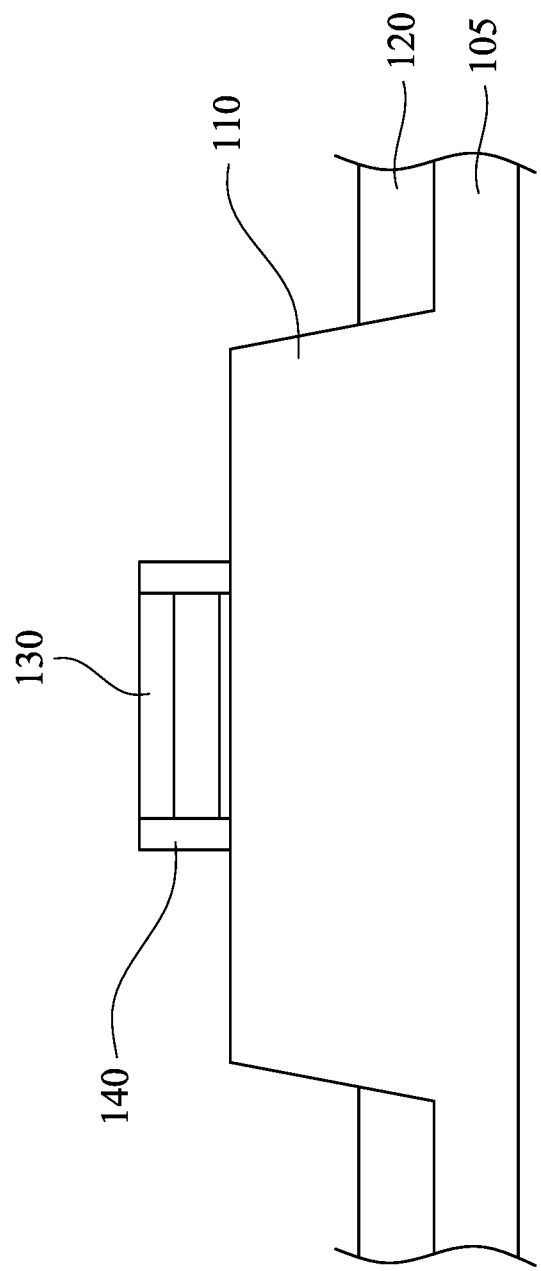

Referring back to FIG. 2A, the method M then proceeds to block S103 where gate spacers are formed along sidewalls of the gate stack. With reference to FIG. 5, in some embodiments of block S103, gate spacers 140 are formed along sidewalls of the gate stack 130. In some embodiments, the gate spacers 140 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials. The gate spacers 140 may include a single layer or multilayer structure made of different dielectric materials. The method of forming the gate spacers 140 include blanket forming a dielectric layer on the structure shown in FIG. 4 using, for example, CVD, PVD or ALD, and then performing an etching process such as anisotropic etching to remove horizontal portions of the dielectric layer. The remaining portions of the dielectric layer on sidewalls of the gate stack 130 can serve as the gate spacers 140. In some embodiments, the gate spacers 140 may be used to offset subsequently formed doped regions, such as source/drain regions. The gate spacers 140 may further be used for designing or modifying the source/drain region profile.

Figure 6:
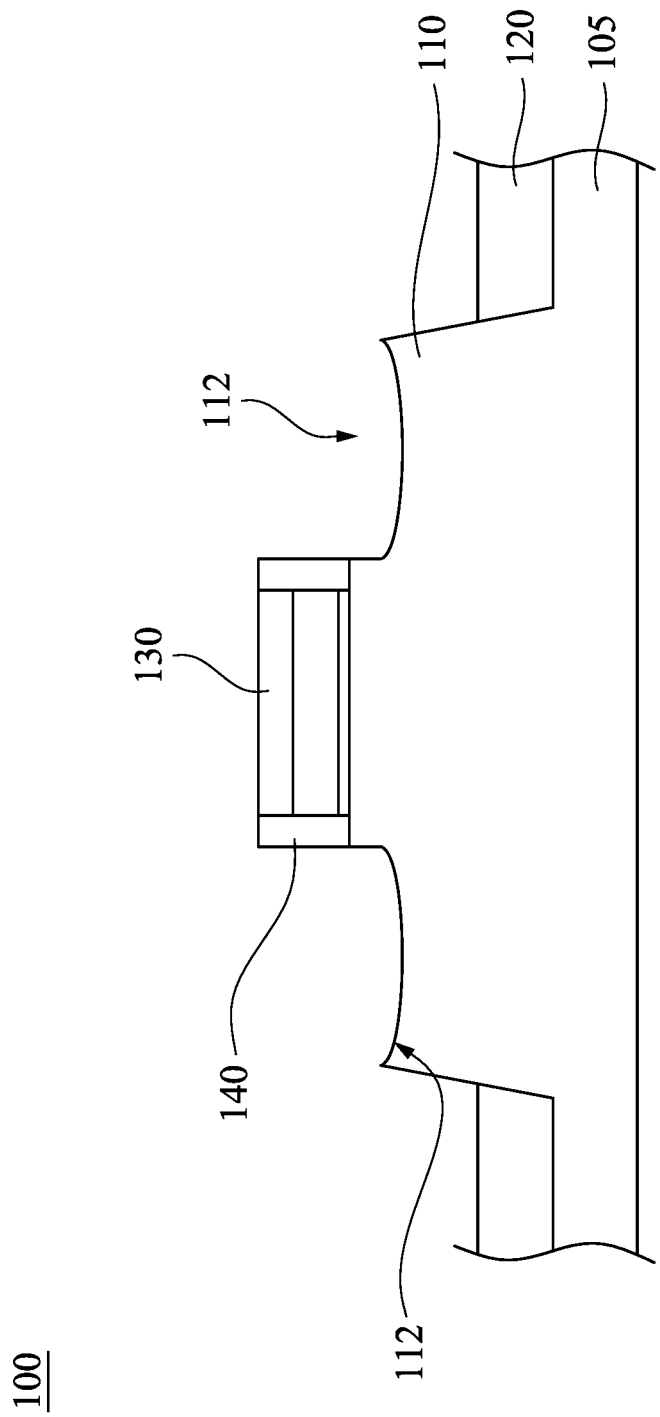

Referring back to FIG. 2A, the method M then proceeds to block S104 where source/drain recesses are formed into the semiconductor fin. With reference to FIG. 6, in some embodiments of block S104, portions of the semiconductor fin 110 not covered by the gate stack 130 and the gate spacers 140 are recessed to form source/drain recesses 112. Formation of the source/drain recesses 112 may include a dry etching process, a wet etching process, or combination dry and wet etching processes. This etching process may include reactive ion etch (RIE) using the gate stack 130 and gate spacers 140 as masks, or by any other suitable removal process. After the etching process, a pre-cleaning process may be performed to clean the recesses 112 with hydrofluoric acid (HF) or other suitable solution in some embodiments.

Figure 7:
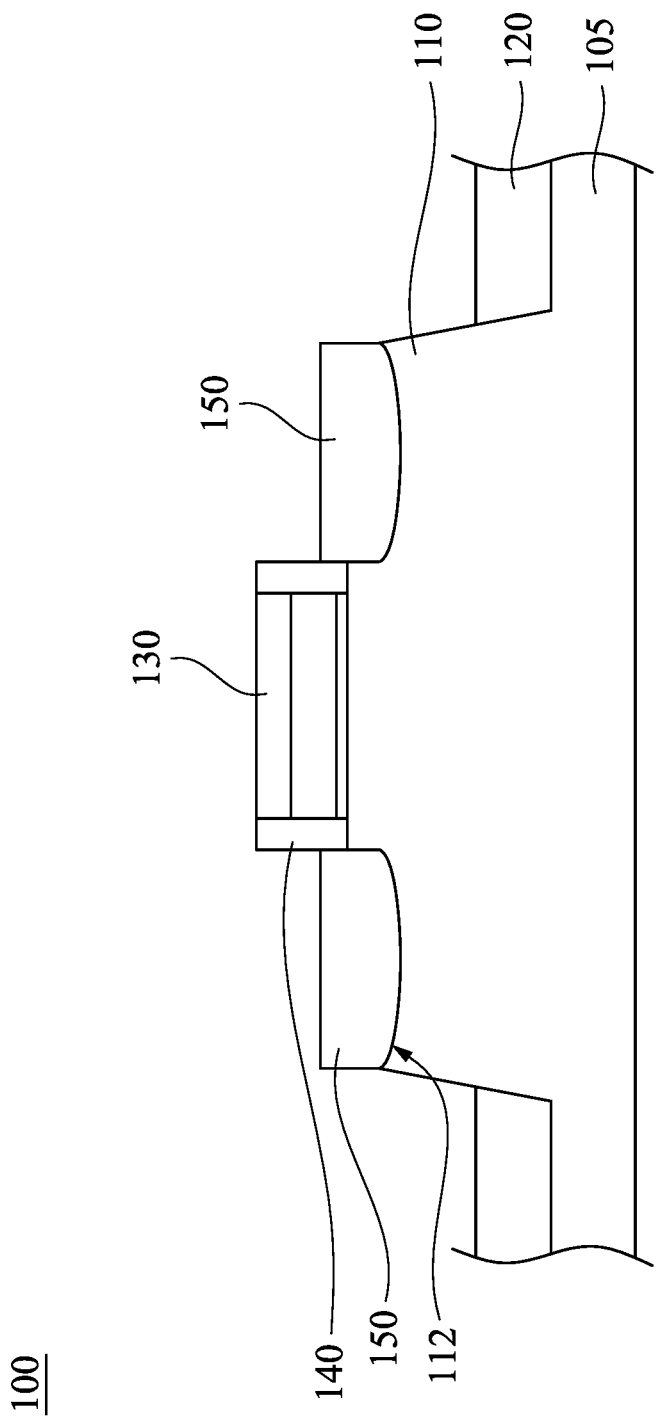

Referring back to FIG. 2A, the method M then proceeds to block S105 where source/drain structures are formed into the source/drain recesses. With reference to FIG. 7, in some embodiments of block S105, epitaxial source/drain structures 150 are respectively formed in the source/drain recesses 112. The epitaxial source/drain structures 150 may be formed using one or more epitaxy or epitaxial (epi) processes, such that Si features, SiGe features, silicon phosphate (SiP) features, silicon carbide (SiC) features and/or other suitable features can be formed in a crystalline state on the semiconductor fins 110. In some embodiments, lattice constants of the epitaxial source/drain structures 150 are different from that of the semiconductor fin 110, so that the channel region between the epitaxial source/drain structures 150 can be strained or stressed by the epitaxial source/drain structures 150 to improve carrier mobility of the semiconductor device and enhance the device performance.

The epitaxy process includes CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 110 (e.g., silicon, silicon germanium, silicon phosphate, or the like). The epitaxial source/drain structures 150 may be in-situ doped. The doping species include p-type dopants, such as boron or $BF_2$; n-type dopants, such as phosphorus or arsenic; and/or other suitable dopants including combinations thereof. If the epitaxial source/drain structures 150 are not in-situ doped, an implantation process is performed to dope the epitaxial source/drain structures 150. One or more annealing processes may be performed to activate the epitaxial source/drain structures 150. The annealing processes include rapid thermal annealing (RTA) and/or laser annealing processes.

Figure 8:
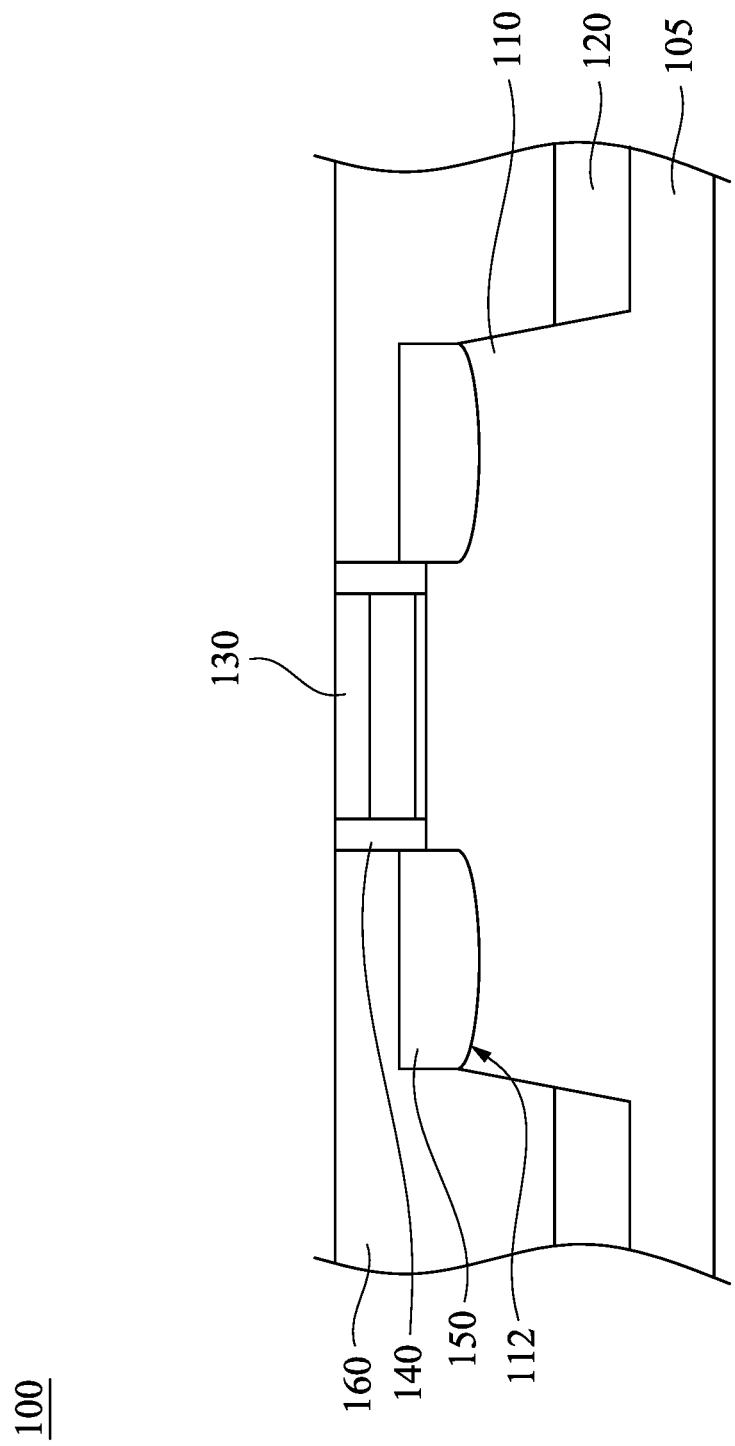

Referring back to FIG. 2A, the method M then proceeds to block S106 where a first interlayer dielectric (ILD) layer is deposited over the source/drain structures. With reference to FIG. 8, in some embodiments of block S106, an ILD layer 160 is deposited over the source/drain structures 150, the gate stack 130, and the gate spacers 140, followed by performing a CMP process to remove excessive material of the ILD layer 160 to expose the gate stack 130. The CMP process may planarize a top surface of the ILD layer 160 with a top surface of the gate stack 130 and gate spacers 140. In some embodiments, the ILD layer 160 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 160 may be formed using, for example, CVD, ALD, spin-on-glass (SOG) or other suitable techniques.

Figure 9:
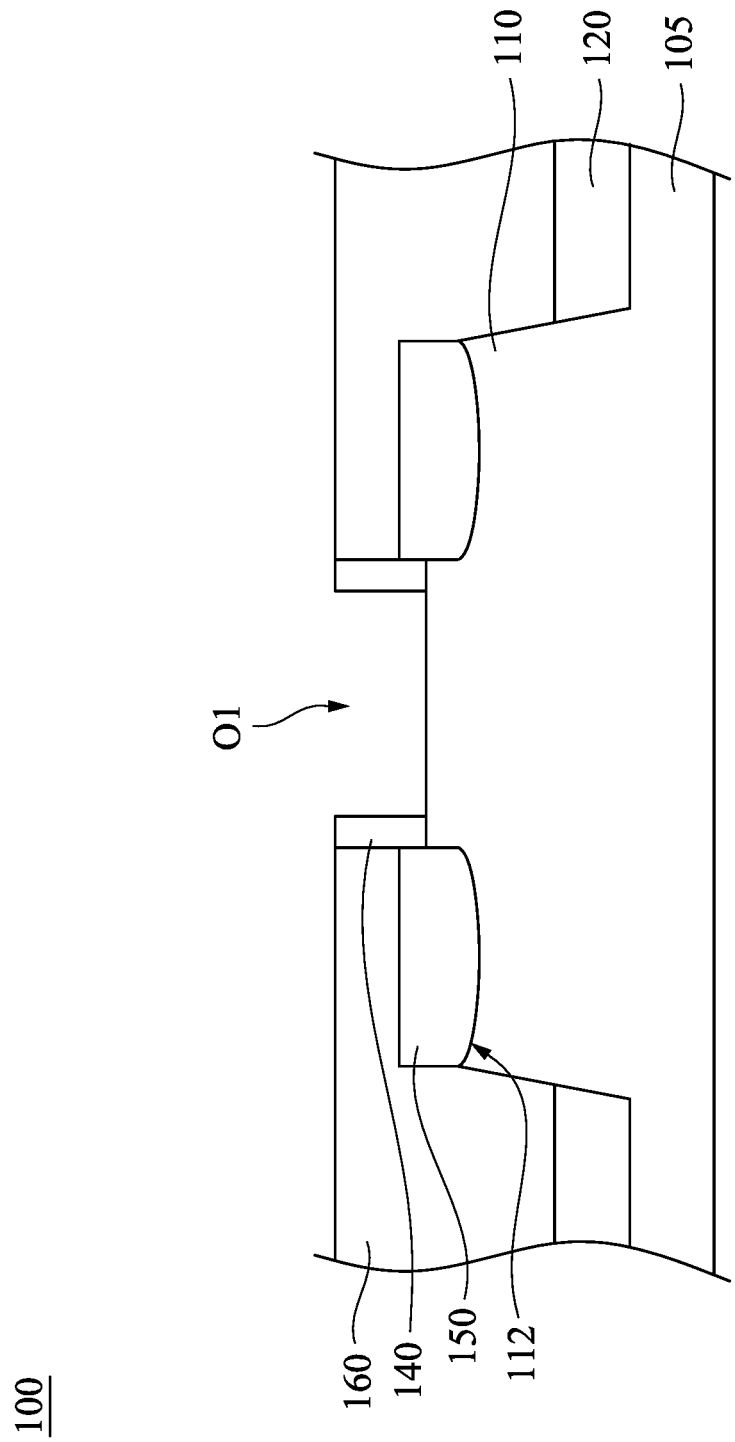

Referring back to FIG. 2A, the method M then proceeds to block S107 where at least a portion of the gate stack is removed to form a gate trench. With reference to FIG. 9, in some embodiments of block S107, at least portions of the gate stack 130 (see FIG. 8) are removed to form a gate trench O1 with the gate spacers 140 as their sidewalls. In some embodiments, the gate dielectric 132, the dummy electrode 134, and the gate mask 138 (see FIG. 4) are removed as shown in FIG. 9. In some embodiments, the dummy electrode 134, and the gate mask 138 are removed while the gate dielectric 132 are retained. The dummy gate stack 130 may be removed by dry etching, wet etching, or a combination of dry and wet etching. For example, a wet etching process may include exposure to a hydroxide containing solution (e.g., ammonium hydroxide), deionized water, and/or other suitable etchant solutions.

Figure 10:
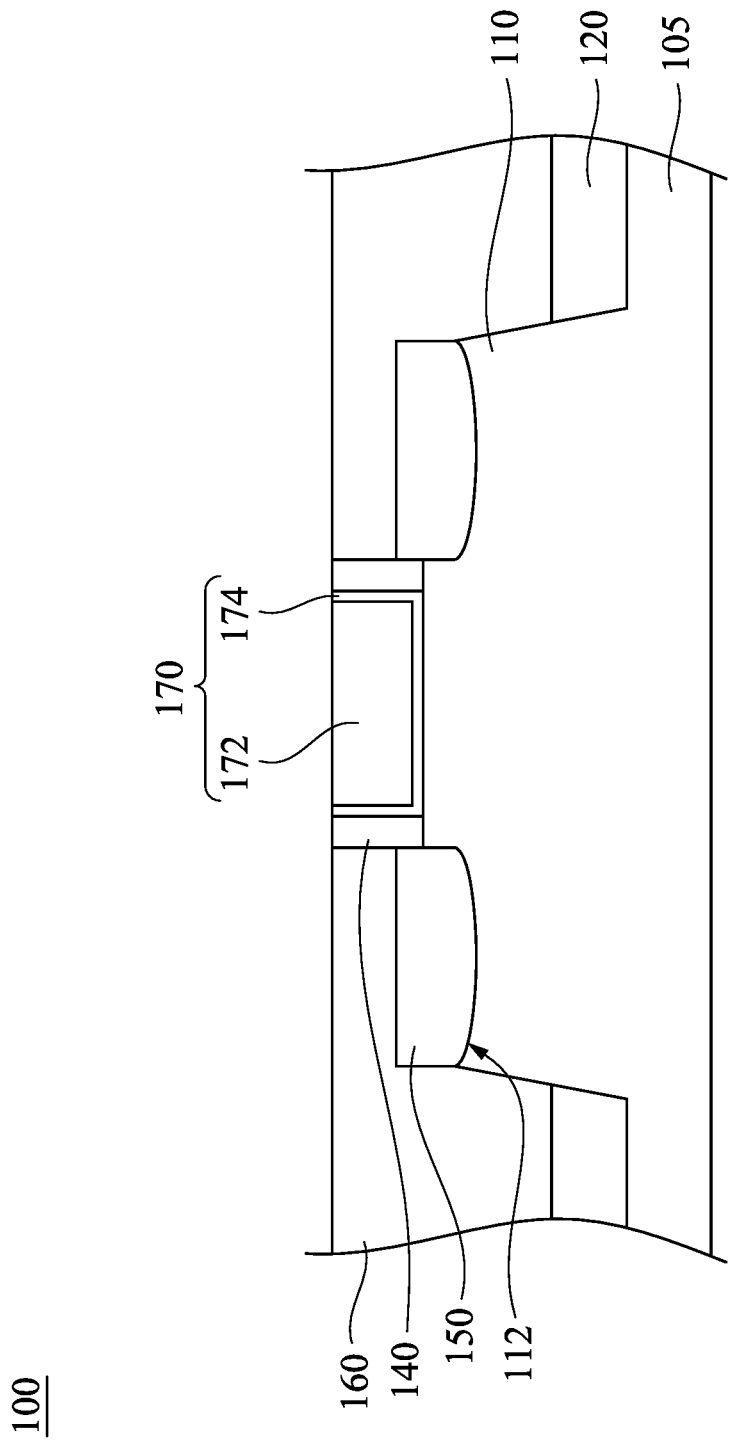

Referring back to FIG. 2A, the method M then proceeds to block S108 where a replacement gate structure is formed in the gate trench. With reference to FIG. 10, in some embodiments of block S108, a replacement gate structure 170 is formed in the gate trench O1 (see FIG. 9). An exemplary method of forming the replacement gate structure 170 may include blanket forming a gate dielectric layer over the substrate 105, forming one or more work function metal layers over the blanket gate dielectric layer, forming a fill metal layer over the one or more work function metal layers, and performing a CMP process to remove excessive materials of the fill metal layer, the one or more work function metal layers and the gate dielectric layer outside the gate trench O1 (see FIG. 9). As a result of this method, the replacement gate structure 170 may include a metal gate electrode 174, and a gate dielectric layer 172 which wraps around the metal gate electrode 174.

In some embodiments, the gate dielectric layer 172 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 172 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layer 192 may have a multilayer structure such as one layer of silicon oxide (e.g., interfacial layer) and another layer of high-k material. In some embodiments, the gate dielectric layer 172 is made of the same material because the gate dielectric layer 172 is formed from the same dielectric layer blanket deposited over the substrate 105.

The metal gate electrode 174 includes suitable work function metals to provide suitable work functions. In some embodiments, the metal gate electrode 174 may include one or more n-type work function metals (N-metal) for forming an n-type transistor on the substrate 105. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the metal gate electrode 174 may include one or more p-type work function metals (P-metal) for forming a p-type transistor on the substrate 105. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. At least two of the work function metals in the metal gate electrode 174 may be made of different work function metals so as to achieve suitable work functions in some embodiments. In some embodiments, an entirety of the metal gate electrode 174 is a work function metal of a same material.

Figure 11:
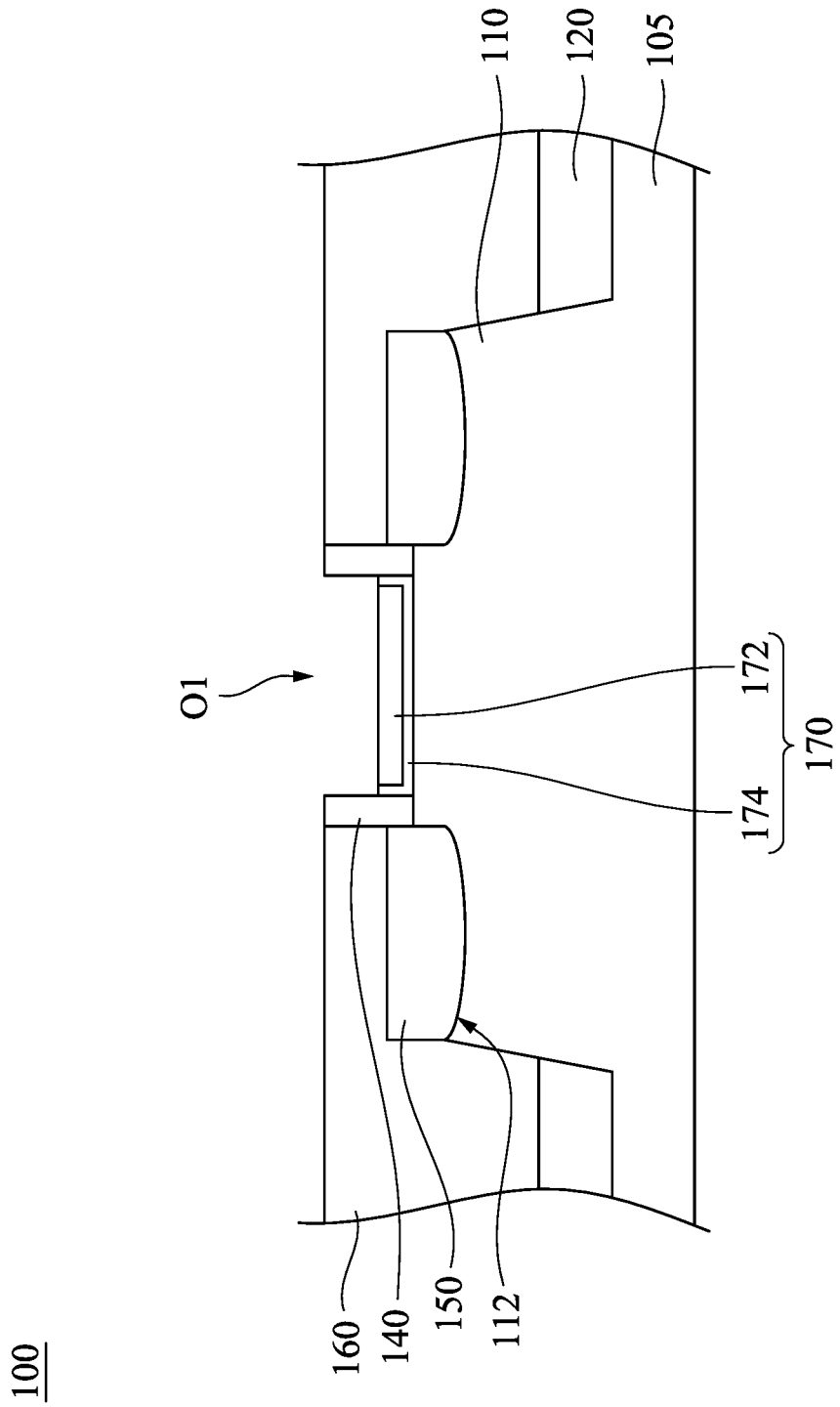

Referring back to FIG. 2A, the method M then proceeds to block S109 where a first etch back process is performed on the replacement gate structure to scale down the replacement gate structure. With reference to FIG. 11, in some embodiments of block S109, a metal gate etch back (MGEB) process is performed on the replacement gate structure 170 to scale down the replacement gate structure 170. The MGEB process may include a bias plasma etching step. The bias plasma etching step may be performed to remove a portion of the replacement gate structure 170 to thin down the replacement gate structure 170. A portion of the gate trench O1 may reappear with shallower depth. A top surface of the replacement gate structure 170 may be no longer level with the ILD layer 160. Sidewalls of the gate spacers 140 are then exposed from the replacement gate structure 170. In some embodiments, the bias plasma etching step may use a gas mixture of $Cl_2$, $O_2$, $BCl_3$, and Ar with a bias in a range from about 25V to about 1200V.

Figure 12:
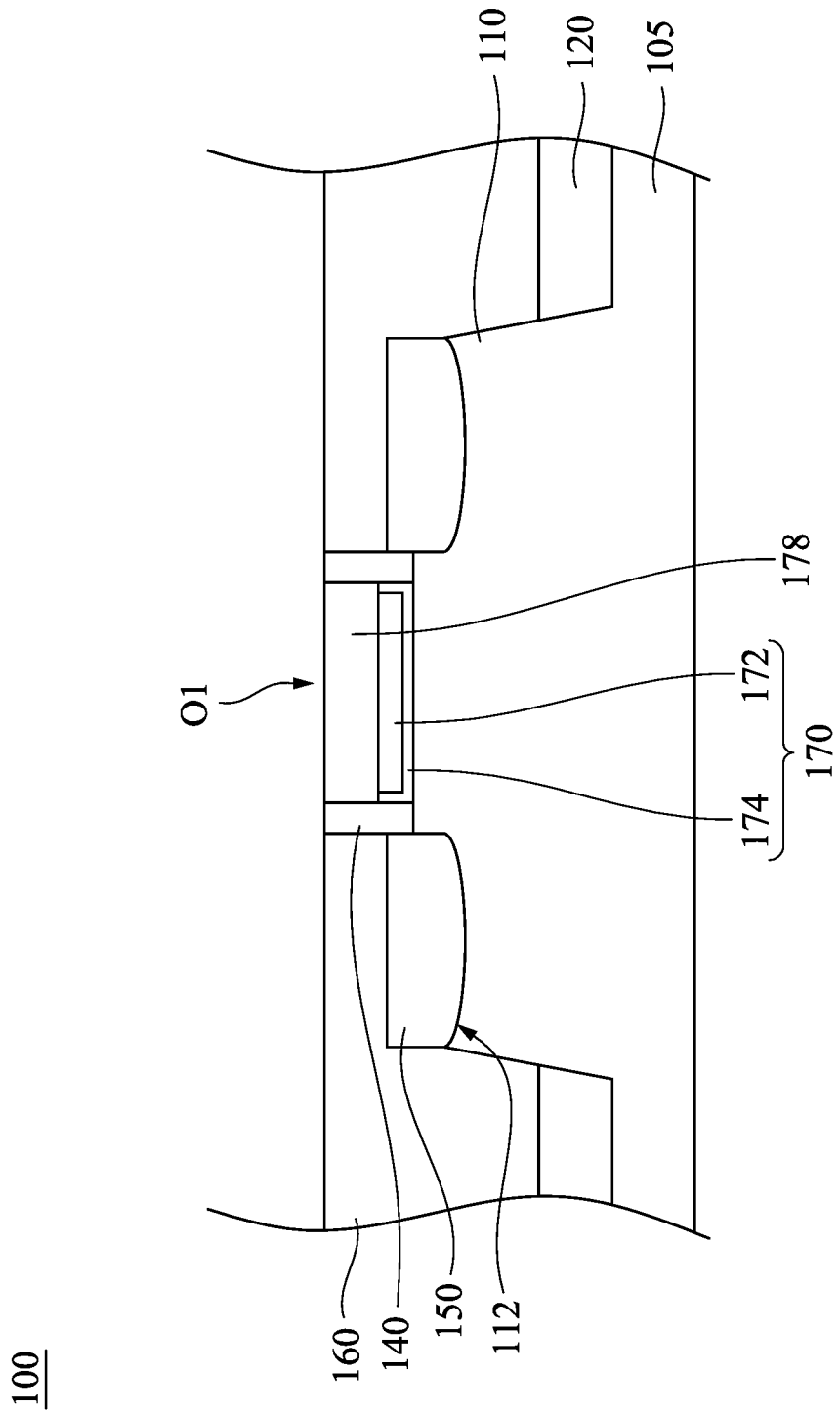

Referring back to FIG. 2A, the method M then proceeds to block S110 where a first dielectric cap is formed over the replacement gate structure. With reference to FIG. 12, in some embodiments of block S110, a dielectric cap 178 is formed over the replacement gate structure 170 using, for example, a deposition process to deposit a dielectric material over the substrate 105, followed by a CMP process to remove excess dielectric material outside the gate trench O1. In some embodiments, the dielectric cap 178 may include $SiN_x$, $SiO_x$, SiON, SiC, SiBN, SiCBN, other suitable dielectric materials, or combinations thereof. The dielectric cap 178 has different etch selectivity than the gate spacers 140 and/or the ILD layer 160, so as to selective etch back the dielectric cap 178. By way of example, if the dielectric cap 178 is made of silicon nitride, the gate spacers 140 and/or the ILD layer 160 is made of a dielectric material different from silicon nitride. The dielectric cap 178 can be used to define self-aligned source/drain contact region and thus referred to as a self-aligned contact (SAC) structure or a SAC layer. In some embodiments, the dielectric cap 178 can be interchangeably referred to as a protective structure or a protective layer.

Figure 13:
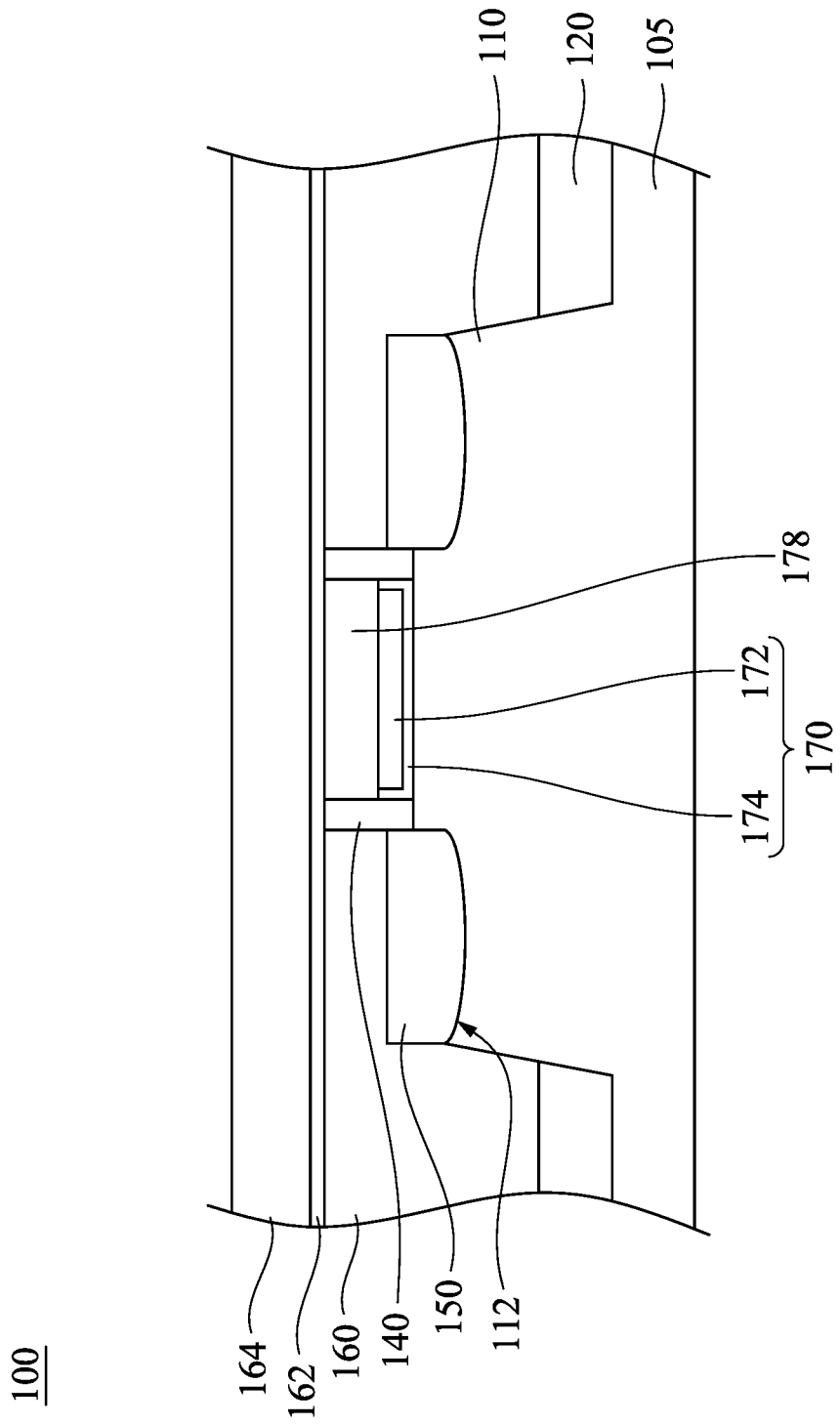

Referring back to FIG. 2A, the method M then proceeds to block S111 where a first contact etch stop layer (CESL) and a second ILD layer are deposited over the substrate. With reference to FIG. 13, in some embodiments of block S111, a CESL 162 is deposited over the gate spacers 140, the ILD layer 160, and the dielectric cap 178. Subsequently, an ILD layer 164 is deposited over the CESL 162. In some embodiments, the CESL 162 may include $SiN_x$, $SiO_x$, SiON, SiC, SiBN, SiCBN, other suitable dielectric materials, or combinations thereof. In some embodiments, the CESL 162 may be made of a different material than the dielectric cap 178, the gate spacers 140, and/or the ILD layer 160. By way of example, if the CESL 162 is made of silicon nitride, the gate spacers 140 and/or the ILD layer 160 is made of a dielectric material different from silicon nitride. In some embodiments, the CESL 162 can be formed using, for example, plasma enhanced CVD, low pressure CVD, ALD or other suitable techniques. In some embodiments, the ILD layer 164 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD layer 164 may be formed using, for example, CVD, ALD, spin-on-glass (SOG) or other suitable techniques.

Figure 14:
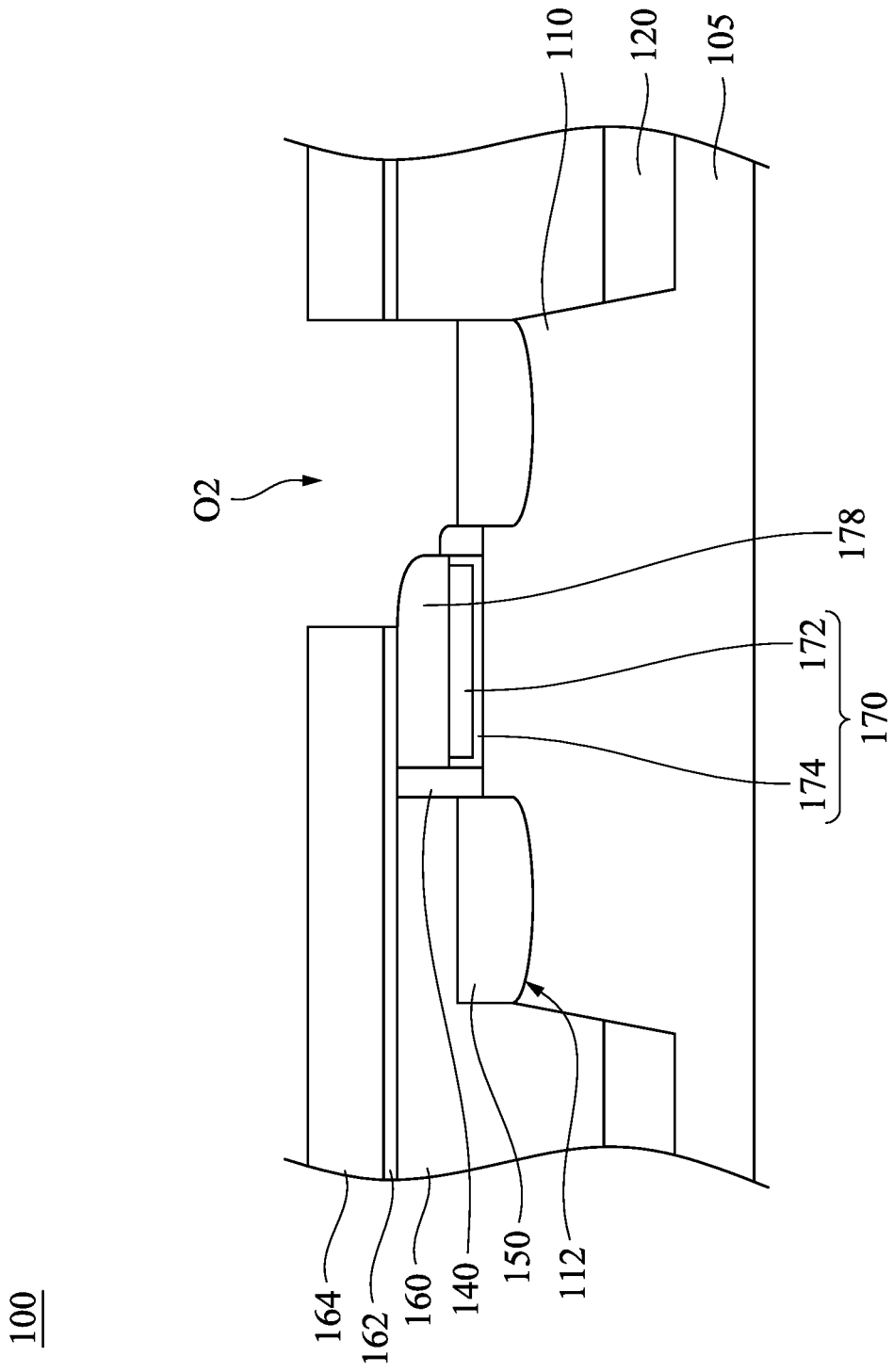

Referring back to FIG. 2A, the method M then proceeds to block S112 where a source/drain contact opening is formed through the first and second ILD layers and the first CESL to expose the epitaxial source/drain structure. With reference to FIG. 14, in some embodiments of block S112, one or more etching process may be performed to sequentially etch through the ILD layer 164, the CESL 162, and ILD layer 160 down to the epitaxial source/drain structure 150 to form a source/drain contact opening O2. In some embodiments, the etching process would consume the gate spacer 140 and/or the dielectric cap 178, and thus the gate spacer 140 and/or the dielectric cap 178 may be damaged as shown in FIG. 14. That is, the dielectric cap 178 exposed in the source/drain contact opening O2 may have a thinner thickness than under the CESL 162 and the ILD layer 164. The gate spacer 140 exposed in the source/drain contact opening O2 may have a thinner thickness than under the CESL 162 and the ILD layer 164.

This is described in greater detail with reference to FIG. 14, a patterned mask layer (not shown) may be formed over the substrate 105. In some embodiments, the mask layer is formed by spin coating a resist material (e.g., the mask layer may be also referred to as a photo resist layer), followed by a process, such as a soft baking process and a hard baking process (may be also referred to as a pre-exposure baking). In some embodiments, the mask layer is a DUV resist such as a krypton fluoride (KrF) resist or an argon fluoride (ArF) resist. In some embodiments, the mask layer is an I-line resist, a EUV resist, an electron beam (e-beam) resist, or an ion beam resist. In some embodiments, the mask layer is a positive resist. The positive resist is insoluble in a developer but becomes soluble upon radiation. One exemplary positive resist is a chemically amplified resist (CAR) that contains backbone polymer protected by acid labile groups (ALGs) and further contains photo-acid generators (PAGs). The PAGs can produce an acid upon radiation and the acid can catalyze the cleaving of the ALGs from the backbone polymer, increasing the polymer's solubility to a positive tone developer. In some embodiments, the mask layer is a negative resist. The negative resist is soluble in a developer but becomes insoluble upon radiation. After coating the mask layer over the substrate 105, the mask layer is exposed to a radiation through a mask. After exposing the mask layer to the radiation is complete, the exposed mask layer undergoes one or more post-exposure baking (PEB) processes. Subsequently, a developing process is performed, such that portions of the exposed mask layer are removed, and the mask layer acts as a mask to protect the replacement gate structure 170 from a subsequent etching process. When the etching process is complete, the source/drain contact opening O2 is formed to run through the ILD layer 164, the CESL 162, and ILD layer 160 and to expose the epitaxial source/drain structure 150.

The etching process etches the ILD layers 160 and 164 and the CESL 162 at a faster etch rate than it etches the gate spacer 140 and the dielectric cap 178. By way of example and not limitation, a ratio of the etch rate of the ILD layer 164, the CESL 162, and/or ILD layer 160 to the etch rate of the gate spacer 140 and/or the dielectric cap 178 may be greater than about 2. If the ratio of the etch rate of the ILD layer 164, the CESL 162, and/or ILD layer 160 to the etch rate of the gate spacer 140 and/or the dielectric cap 178 is less than about 2, the etching process would significantly consume the gate spacer 140 and/or the dielectric cap 178 to expose the replacement gate structure 170, which in turn increases a risk that a leakage current could flow between the replacement gate structure 170 and a source/drain contact formed subsequently in the source/drain contact opening O2 and thus the yield of the semiconductor device 100 may reduce. In some embodiments, a ratio of the etch rate of the ILD layer 164, the CESL 162, and/or ILD layer 160 to the etch rate of the gate spacer 140 and/or the dielectric cap 178 may be greater than about 10.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, $CH_3F$ and/or $C_4F_8$), a chlorine-containing gas (e.g., $Cl_2$ and/or $BCl_3$), a bromine-containing gas (e.g., HBr), an iodine-containing gas, other suitable gases and/or plasmas, and/or combinations thereof.

Figure 15:
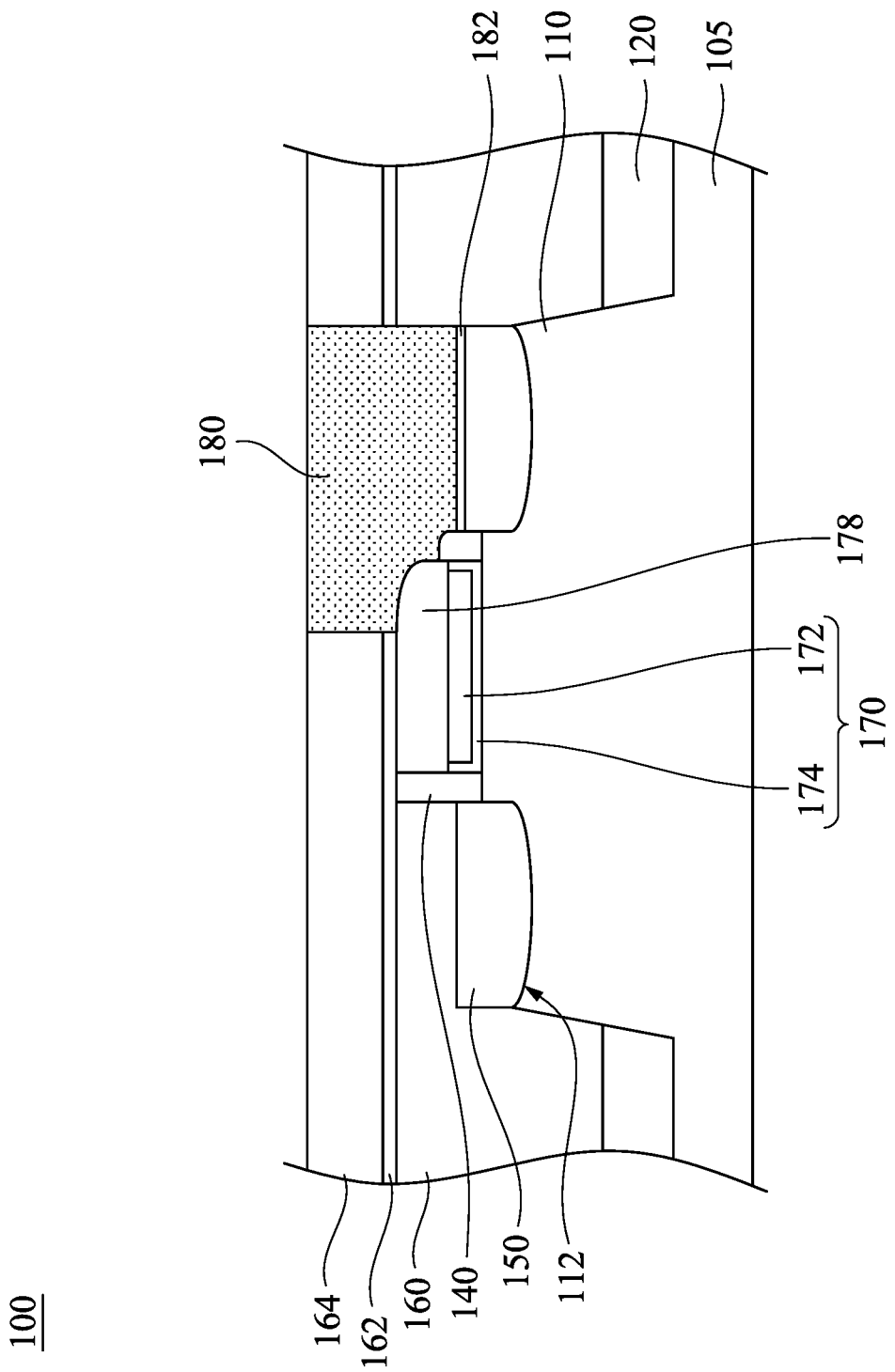

Referring back to FIG. 2B, the method M then proceeds to block S113 where a source/drain contact is formed in the source/drain contact opening. With reference to FIG. 15, in some embodiments of block S113, a source/drain contact 180 is formed in the source/drain contact opening O2 (see FIG. 14) and lands on the epitaxial source/drain structure 150. In some embodiments, the source/drain contact 180 can be interchangeably referred to as a metal-like defined (MD) layer. In greater detail, the source/drain contact 180 may formed by using a metallization process as well as the use of metal electroplating techniques to fill the source/drain contact opening O2. In some embodiments, in order to avoid diffusion of metal from the source/drain contact 180 into the ILD layer 160, a barrier layer (not shown) is used between the source/drain contact 180 and the ILD layer 160. The barrier layer may line the source/drain contact opening O2. The barrier layer functions as a diffusion barrier to prevent metal diffusion and as an adhesion layer between metal and dielectric. By way of example but not limitation, refractory metals, refractory metal-nitrides, refractory metal-silicon-nitrides and combinations thereof may be used for the barrier layer, such as TaN, Ta, Ti, TiN, TiSiN, WN, or combinations thereof. In some embodiments, the barrier layer may include a TaN layer and a Ta layer. In some embodiments, the barrier layer is a TiN layer. In some embodiments, the barrier layer is a Ti layer. In some embodiments, a metal seed layer (not shown) is then formed on the barrier layer. In some embodiments, the metal seed layer is a copper seed layer that may be formed by physical vapor deposition by way of example but not limitation.

Subsequently, the substrate 105 may be transferred to a plating tool, such as an electrochemical plating (ECP) tool, and a conductive layer is plated on the substrate 105 by the plating process to fill the source/drain contact opening O2 (see FIG. 14). While ECP process is described herein, the embodiment is not limited to ECP deposited metal. The conductive layer may include a low resistivity conductor material selected from the group of conductor materials including, but not limited to, copper and copper-based alloy. Alternatively, the conductive layer may include various materials, such as cobalt, tungsten, ruthenium, aluminum, gold, silver, another suitable conductive material, or combinations thereof. In some embodiments, the conductive layer may be a copper-containing layer formed over the copper seed layer. Subsequently, the excess portions of the conductive layer, the metal seed layer, and the barrier layer are removed, either through etching, chemical mechanical polishing (CMP), or the like, forming the upper surface of the metal-filled opening substantially coplanar with a top surface of the ILD layer 164. The remaining portions of the conductive layer and the barrier layer in the source/drain contact opening O2 forms the source/drain contact 180.

In some embodiments, before the source/drain contact 180 is formed, a silicide layer 182 may be formed on the epitaxial source/drain structure 150 by a metal silicidation process. The metal silicidation process is to make a reaction between metal and silicon (or polycrystalline silicon). Regarding the metal silicidation process, a first rapid thermal annealing (RTA) process may be performed in, for example, Ar, He, N2 or other inert atmosphere at a first temperature, such as lower than 200~300° C, to convert the deposited metal layer into metal silicide. This is followed by an etching process to remove the unreacted metal layer from. The etching process may include a wet etch, a dry etch, and/or a combination thereof. As an example, the etchant of the wet etching may include a mixed solution of $H_2SO_4$, $H_2O_2$, $H_2O$, and/or other suitable wet etching solutions, and/or combinations thereof. Then, a second annealing or RTA step at a second temperature higher than the first temperature, such as 400~500° C., thereby forming a stable silicide layer 182 with low resistance. In some embodiments, the silicide layer 182 may include titanium silicide (TiSi), nickel silicide (NiSi), cobalt silicide (CoSi), Ni—Pt, or combinations thereof.

Figure 16:
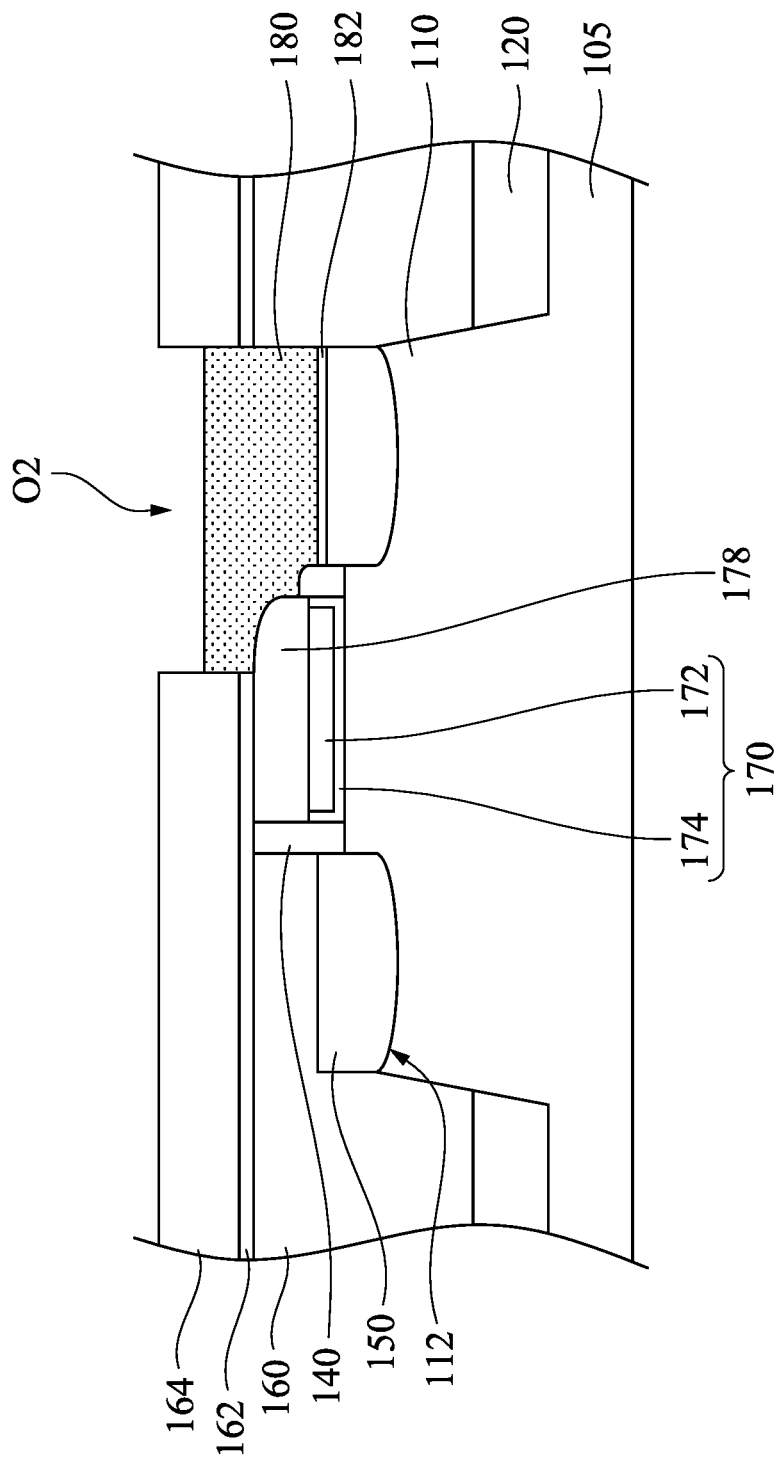

Referring back to FIG. 2B, the method M then proceeds to block S114 where a second etch back process is performed on the source/drain contact to scale down the source/drain contact. With reference to FIG. 16, in some embodiments of block S114, a metal-like defined etch back (MDEB) process is performed on the source/drain contact 180 to scale down the source/drain contact 180. The MDEB process may include a bias plasma etching step. The bias plasma etching step may be performed to remove a portion of the source/drain contact 180 to thin down the source/drain contact 180. A portion of the source/drain contact opening O2 may reappear with shallower depth. A top surface of the source/drain contact 180 may be no longer level with the ILD layer 160. In some embodiments, the bias plasma etching step may use a gas mixture of $Cl_2$, $O_2$, $BCl_3$, and Ar with a bias in a range from about 25V to about 1200V.

Figure 17:
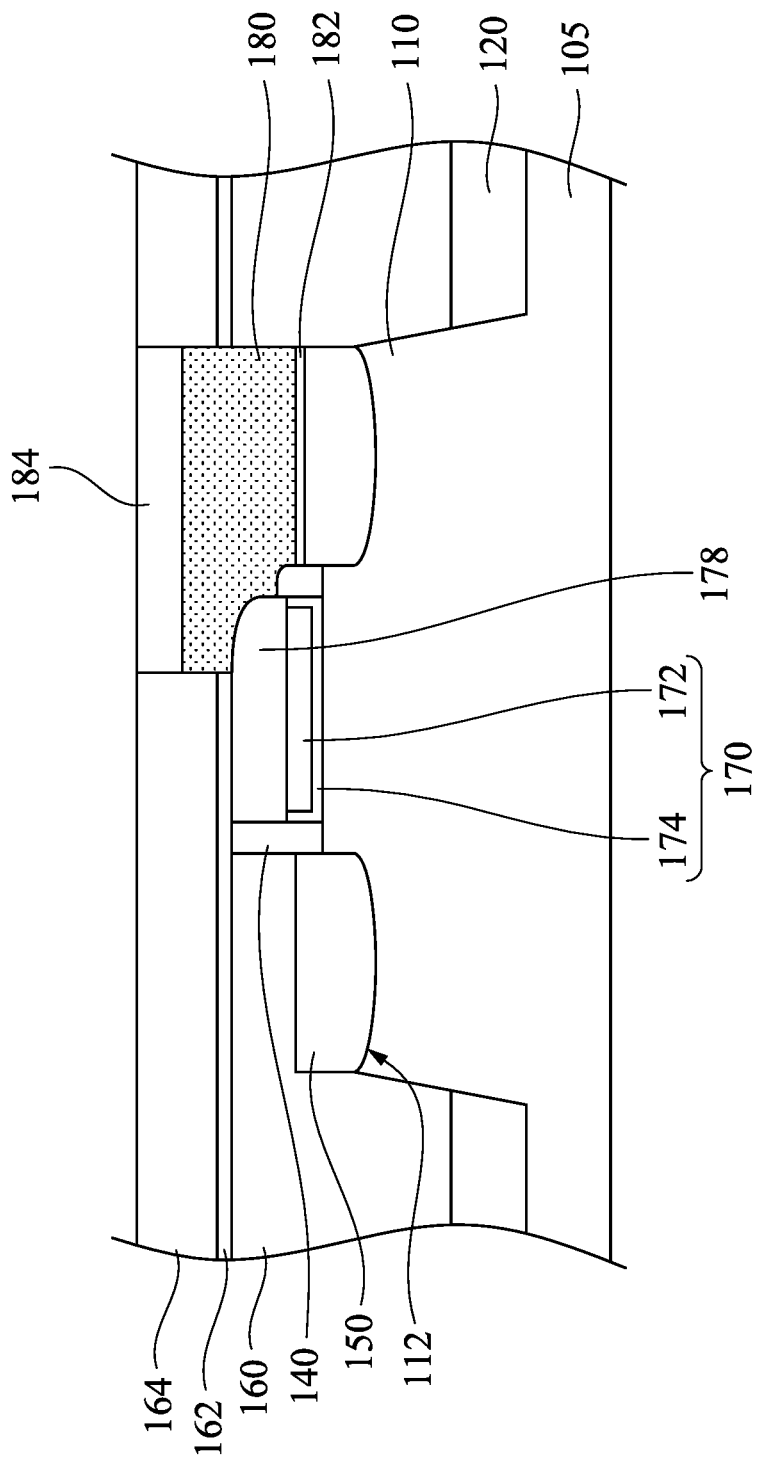

Referring back to FIG. 2B, the method M then proceeds to block S115 where a second dielectric cap is formed over the source/drain contact. With reference to FIG. 17, in some embodiments of block S115, a dielectric cap 184 is formed over the source/drain contact 180 using, for example, a deposition process to deposit a dielectric material over the substrate 105, followed by a CMP process to remove excess dielectric material outside the source/drain contact opening O2 (see FIG. 16). In some embodiments, the dielectric cap 184 may include $SiN_x$, $SiO_x$, SiON, SiC, SiBN, SiCBN, other suitable dielectric materials, or combinations thereof. The dielectric cap 184 has different etch selectivity than the ILD layer 164, so as to selective etch back the dielectric cap 178. By way of example, if the dielectric cap 184 is made of silicon carbide (SiC), the ILD layer 164 may be made of a dielectric material different from silicon carbide. If the dielectric cap 184 is made of silicon nitride (SiN), the ILD layer 164 may be made of a dielectric material different from silicon nitride. Therefore, the dielectric cap 184 can be used to define self-aligned gate contact region and thus referred to as a self-aligned contact (SAC) structure or a SAC layer. In some embodiments, the dielectric cap 184 can be interchangeably referred to as a protective structure or a protective layer.

Figure 18:
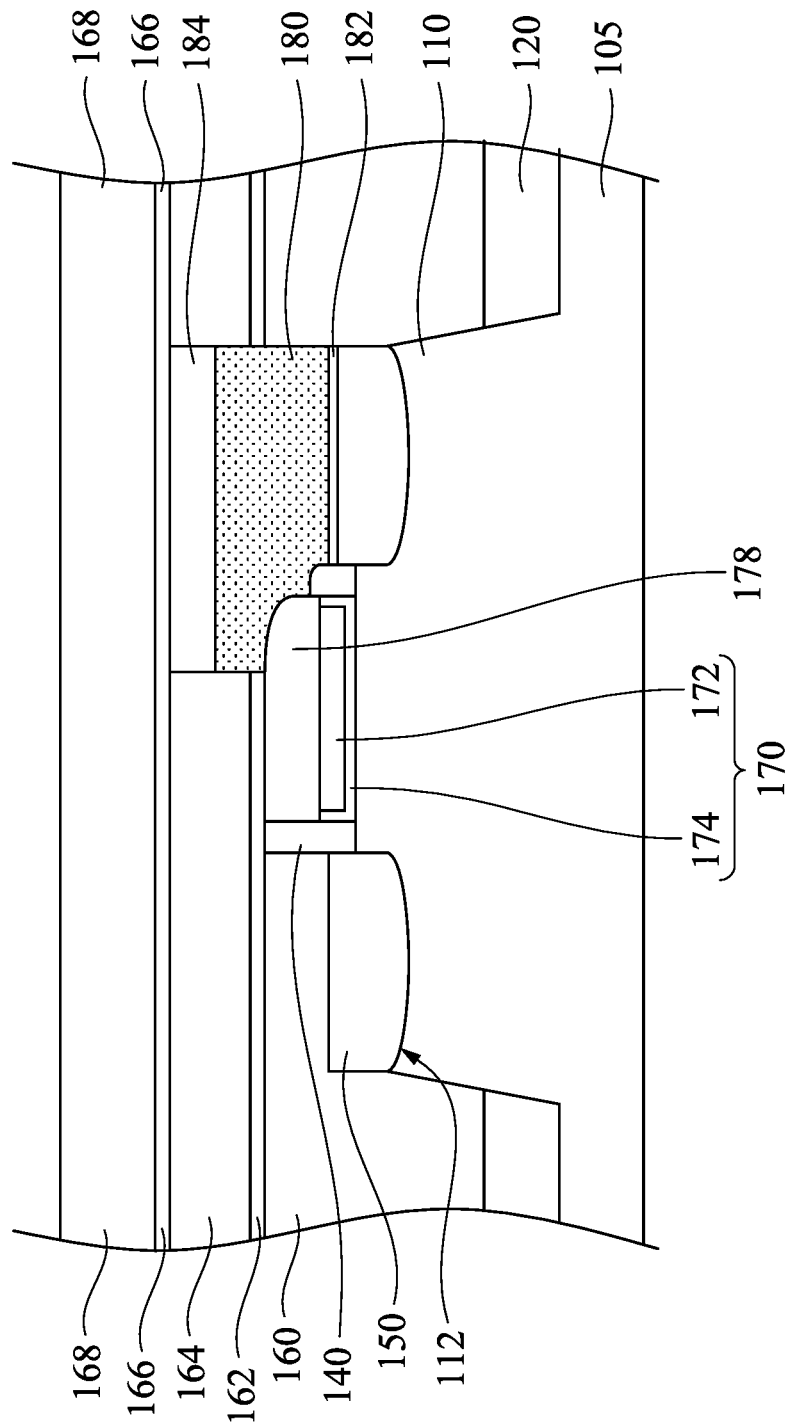

Referring back to FIG. 2B, the method M then proceeds to block S116 where a second CESL and a third ILD layer are deposited over the substrate. With reference to FIG. 18, in some embodiments of block S116, a CESL 166 is deposited over the ILD layer 164. Subsequently, an ILD layer 168 is deposited over the CESL 166. In some embodiments, the CESL 166 may include $SiN_x$, $SiO_x$, SiON, SiC, SiBN, SiCBN, other suitable dielectric materials, or combinations thereof. In some embodiments, the CESL 168 may be made of a different material than the ILD layer 164. By way of example, if the ILD layer 164 is made of silicon oxide, the CESL 166 is made of a dielectric material different from silicon oxide. In some embodiments, the CESL 166 can be formed using, for example, plasma enhanced CVD, low pressure CVD, ALD or other suitable techniques. In some embodiments, the ILD layer 168 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD layer 168 may be formed using, for example, CVD, ALD, spin-on-glass (SOG) or other suitable techniques.

Figure 19:
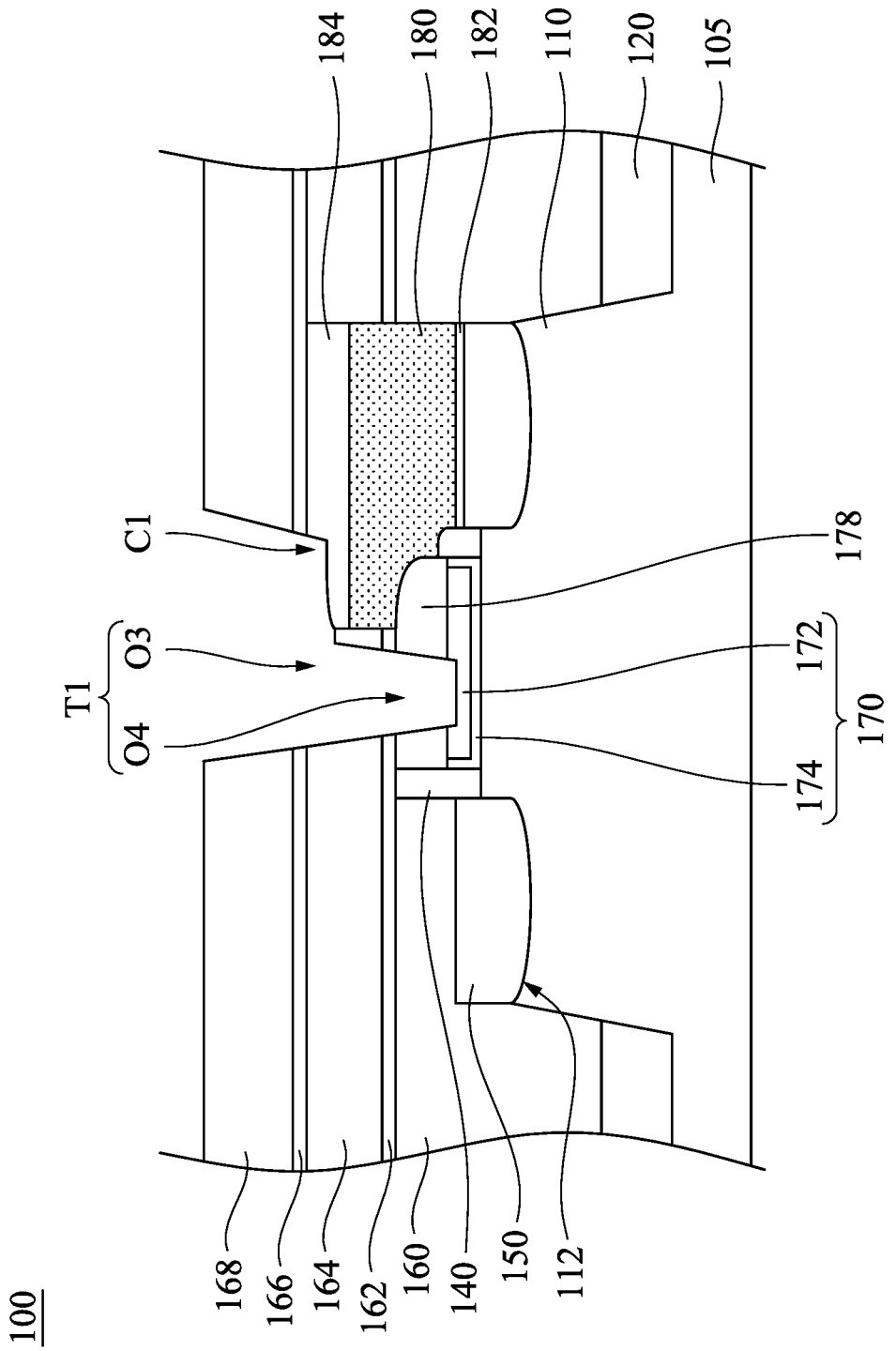
Figure 23:
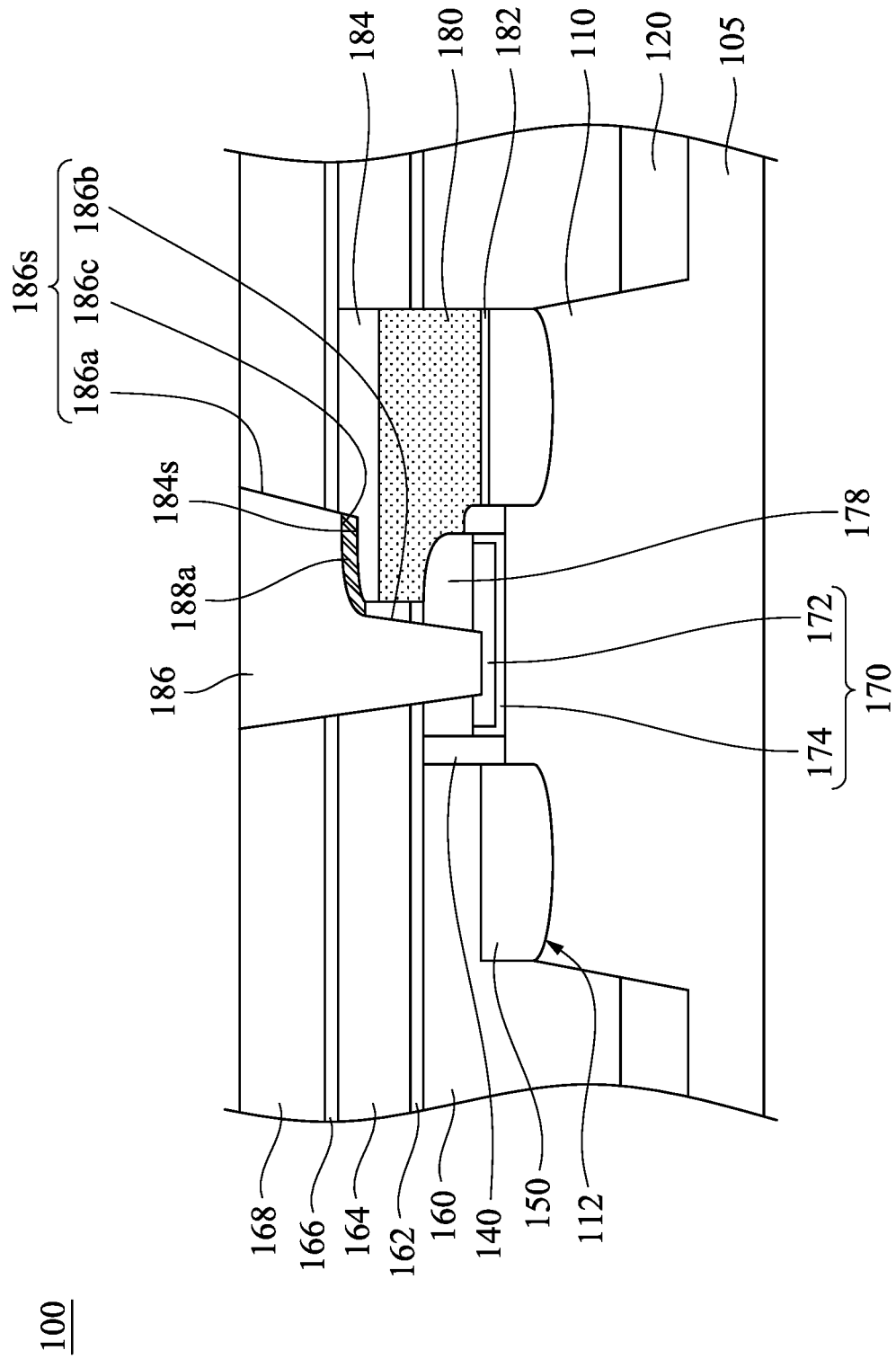

Referring back to FIG. 2B, the method M then proceeds to block S117 where a gate contact opening is formed through the second and third ILD layers to expose the replacement gate structure and a portion of the second dielectric cap. With reference to FIG. 19, in some embodiments of block S117, a wide opening O3 is formed in the ILD layer 168 and over the replacement gate structure 170 and the source/drain contact 180, and a narrow opening O4 is formed to extend from a bottom of the wide opening O3 downwardly to the replacement gate structure 170. In some embodiments, the wide opening O3 and the narrow opening O4 can be collectively referred to as a gate contact opening Ti where gate contact 186 will be subsequently formed therein as shown in FIG. 23. The gate contact opening T1 can be formed by dual damascene-like techniques such as, for example, a trench-first patterning method or a via-first patterning method. Suitable photolithography and etching techniques can be employed in the trench-first patterning method or the via-first patterning method.

Figure 21:
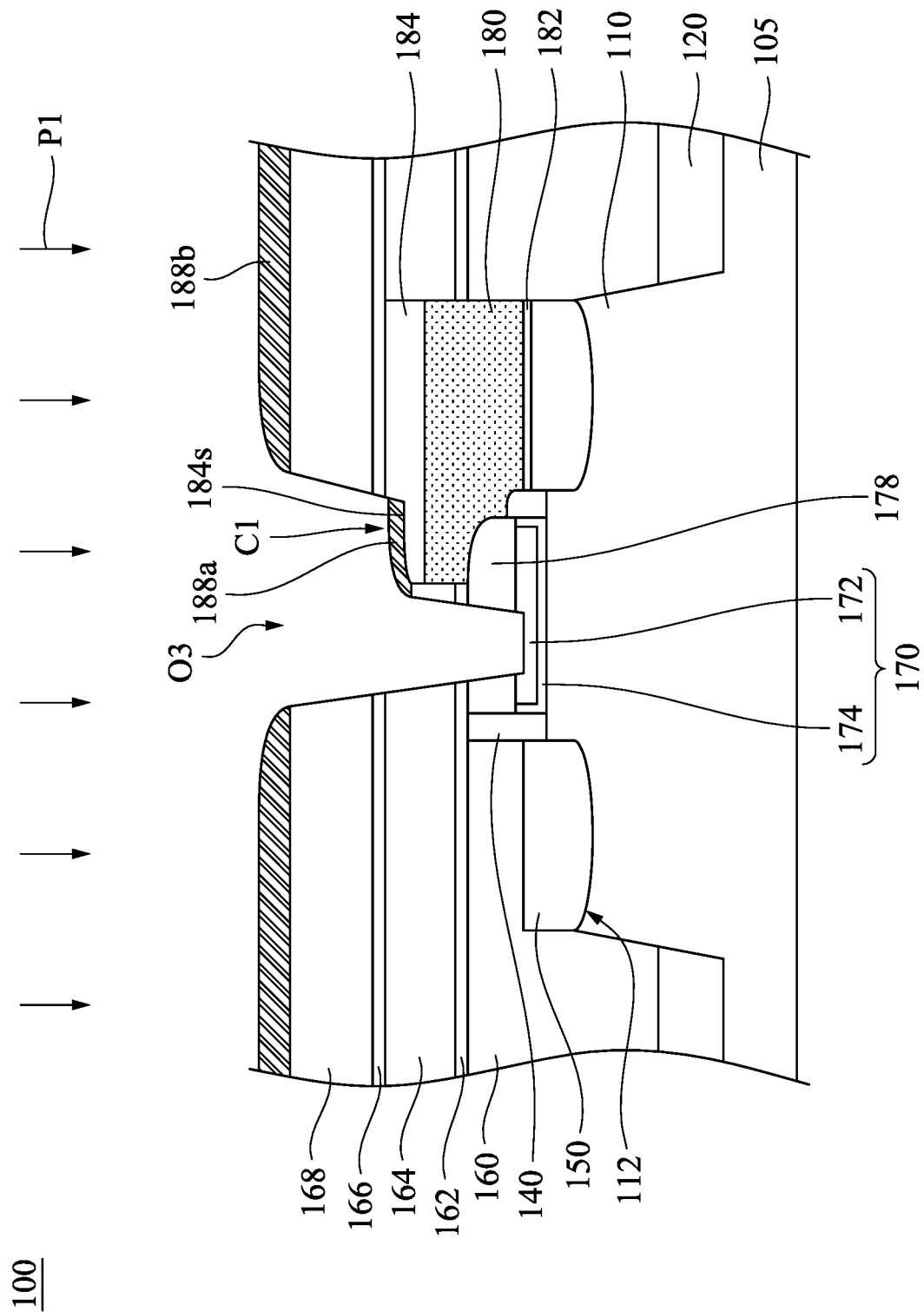

This is described in greater detail with reference to FIG. 19, one or more etching process may be performed to etch through the ILD layer 168 to form the wide opening O3. In some embodiments, the etching process would sequentially consume the CESL 166 and the dielectric cap 184 over the source/drain contact 180 and the ILD layer 164 adjacent to the source/drain contact 180, and thus the CESL 166, the dielectric cap 184, the ILD layer 164 may be damaged as shown in FIG. 19. The etching process forms a notched corner C1 in the dielectric cap 184. When the etching process is complete, the wide opening O3 is formed to run through the ILD layer 168 and the CESL 166, and ILD layer 160 and to expose the dielectric cap 184. The dielectric cap 184 exposed in the wide opening O3 has a thinner thickness than under the CESL 162 and the ILD layer 168, and thus may not be thick enough to suppress a leakage current. If the gate contact 186 (see FIG. 23) formed subsequently in the wide opening O3 directly lands on the thinned dielectric cap 184, a leakage current may occur to flow between the source/drain contact 180 and the gate contact 186 through the thinned dielectric cap 184, which in turn reduces the yield of the semiconductor device 100. Therefore, an additional capping material 188a as shown in FIG. 21 may be formed over the dielectric cap 184 in the wide opening O3 to increase a distance between the source/drain contact 180 and the gate contact 186 (see FIG. 23), which in turn prevents a leakage current from flowing between the source/drain contact 180 and the gate contact 186, and thus the yield of the semiconductor device 100 can be improved. In some embodiments, the capping material 188a as shown in FIG. 21 can be interchangeably referred to as a leakage barrier.

In some embodiments, the etching process etches the ILD layer 168 at a faster etch rate than it etches the CESL 166 and the dielectric cap 184. By way of example and not limitation, a ratio of the ILD layer 168 to the etch rate of the CESL 166 and/or the dielectric cap 184 may be greater than about 2. If the ratio of the etch rate of the ILD layer 168 to the etch rate of the CESL 166 and/or the dielectric cap 184 is less than about 2, the etching process would significantly consume the CESL 166 and/or the dielectric cap 184 to expose the source/drain contact 180, which in turn increases a risk that a leakage current could flow between the source/drain contact 180 and the gate contact 186. In some embodiments, a ratio of the etch rate of the ILD layer 168 to the etch rate of the CESL 166 and/or the dielectric cap 184 may be greater than about 10.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, $CH_3F$ and/or $C_4F_8$), a chlorine-containing gas (e.g., $Cl_2$ and/or $BCl_3$), a bromine-containing gas (e.g., HBr), an iodine-containing gas, other suitable gases and/or plasmas, and/or combinations thereof.

Referring back to FIG. 2B, the method M then proceeds to block S118 where a capping material is selectively deposited on the second dielectric cap exposed in the gate contact opening. With reference to FIG. 21, in some embodiments of block S118, capping materials 188a and 188b may be selectively deposited on top surfaces of the ILD layers 164 and 168 and the dielectric cap 184 by a selective deposition process P1. Therefore, the capping material 188a on the top surface 184s of the dielectric cap 184 is formed to increase a distance between the source/drain contact 180 and the gate contact 186 (see FIG. 23) formed subsequently in the wide opening O3, which in turn prevents a leakage current from flowing between the source/drain contact 180 and the gate contact 186. In particular, the selective deposition process P1 may include a deposition step, by using a high viscosity dielectric material, to deposit the dielectric material (e.g. a dielectric material 188' in FIG. 20) over the substrate 105 and a sputter step to remove the dielectric material deposited on an inclined surface and a horizontal lower surface above the substrate 105, so as to leave the deposited dielectric material on the horizontal upper surface above the substrate 105 (e.g. the capping materials 188a and 188b on the top surfaces of the ILD layers 164 and 168 and the dielectric cap 184 as shown in FIG. 21). In some embodiments, the capping material 188a is formed to localize to or be inlaid in the notched corner C1 in the dielectric cap 184. In some embodiments, the capping materials 188a and 188b can be interchangeably referred to as dielectric residues. By way of example but not limitation, the capping material 188a on the dielectric cap 184 may have a thickness in a range from about 0.5 nm to about 15 nm, such as 0.5, 1, 2, 3, 4, 5, 6, 7, 8, 9, 10, 11, 12, 13, 14, or 15 nm.

Figure 20:
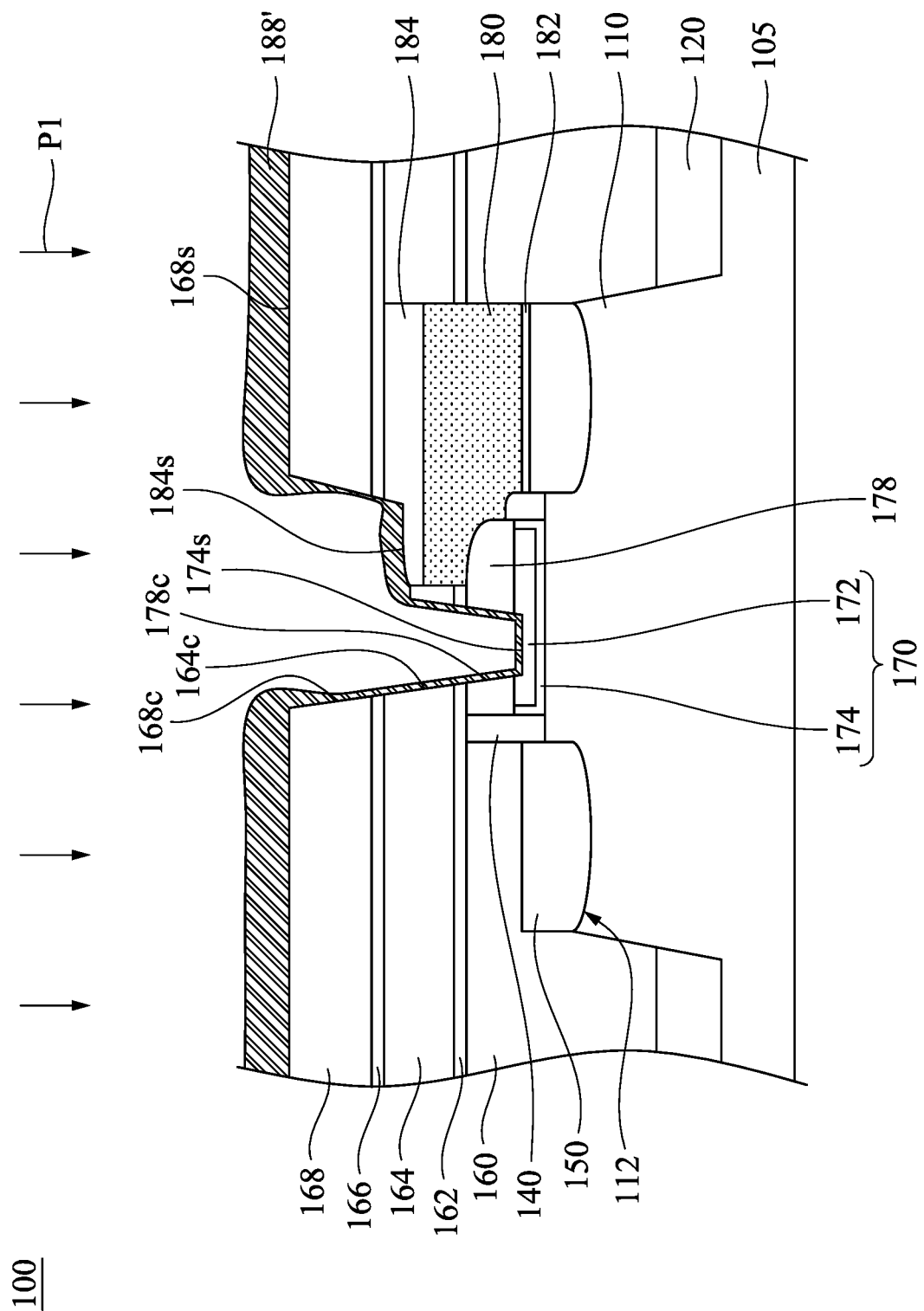

This is described in greater detail with reference to FIG. 20, the deposition step in the selective deposition process P1 with a high viscosity dielectric material will allow a thicker deposition thickness at high position surfaces (e.g. a surface 168s of the ILD layer 168) than at low position surfaces (e.g. a surface 174s of the gate electrode 174) over the substrate 105. In addition, the deposition step with the high viscosity dielectric material will allow a thicker deposition thickness at horizontal surfaces (e.g. the surface 168s of the ILD layer 168 and the surface 184s of the dielectric cap 184) than at inclined surfaces (e.g. surfaces 164c and 168c of the ILD layers 164 and 168 and a surface 178c of the dielectric cap 178) over the substrate 105. In some embodiments, the selective deposition process P1 may be performed by an inductively coupled plasma (ICP) tool or a capacitively coupled plasma (CCP) tool. In some embodiments, the deposition gas used in the selective deposition process P1 may include, for example, a silicon source gas, such as silicon tetrachloride gas, $SiCl_4$, and an oxygen source gas, such as molecular oxygen gas, $O_2$, in plasma state to form a silicon oxide layer with a high viscosity over the substrate 105. In some embodiments, the deposition gas used in the selective deposition process P1 may include, for example, a fluorocarbon ($C_xF_y$) source gas, such as $C_4F_6$ and/or $C_4F_5$, and an oxygen source gas, such as molecular oxygen gas, $O_2$, in plasma state to form a $C_xF_y$ layer with a high viscosity over the substrate 105. In some embodiments, the deposition gas used in the selective deposition process P1 may include a mixture of $BCl_3$ and $N_2$ to deposit boron or boron nitride; a mixture of $BCl_3$, $CH_4$ and $H_2$ to deposit boron carbide. The selective deposition process P1 using the boron-containing precursors may exhibit a higher deposition rate on the material of dielectric cap 184 (e.g., carbide material) than on other materials (e.g., oxide material of ILD 168), which in turns deposits a thicker dielectric material 188' on the dielectric cap 184 than on other surfaces. In some embodiments, the selective deposition process P1 using the boron-containing precursors may deposit the dielectric material 188' on the dielectric cap 184, but not on other surfaces. In some embodiments, the dielectric material 188' may be made a different material than the dielectric cap 184 underlying thereof. In some embodiments, the dielectric material 188' may be made a same material as the dielectric cap 184 underlying thereof.

In some embodiments, sputter etching caused by plasmas in the selective deposition process P1 may provide comparable sputter etch rate at the dielectric material 188' on the inclined surfaces (e.g. the surfaces 164c and 168c of the ILD layers 164 and 168 and the surface 178c of the dielectric cap 178) as the dielectric material 188' on the at horizontal surfaces (e.g. the surface 168s of the ILD layer 168). Because the dielectric material 188' has a higher deposition rate on the horizontal surfaces than on the inclined surfaces, the net effect of the deposition and sputter etching in the selective deposition process P1 leads to the dielectric material 188' remaining on horizontal surfaces and absent on inclined surfaces, as illustrated in FIG. 21. Moreover, in the selective deposition process P1 molecular tends to stick on higher surfaces than on lower surfaces, and thus the net effect of the deposition and sputter etching in the selective deposition process P1 causes thicker dielectric material 188' on the top surface of the ILD 168 than on the top surface of the dielectric cap 184, and causes no or negligible dielectric material 188' at the bottom of the gate contact opening, as illustrated in FIG. 21. The resultant dielectric material 188' on the top surface of the dielectric cap 184 is referred to as a capping material 188a, and the dielectric material 188' on the top surface of the ILD 168 is referred to as a capping material 188b. In some embodiments, the deposition and sputter etching in the selective deposition process P1 to form the capping materials 188a and 188b may be performed in-situ or ex-situ with the etching process of forming the gate contact opening T1.

As shown in FIG. 21, the capping material 188a is spaced apart from the source/drain contact 180 by the dielectric cap 184 and laterally extends beyond an outermost sidewall of the dielectric cap 184 to contact with a top surface of the ILD layer 164 laterally surrounding the source/drain contact 180 and the dielectric cap 184. In some embodiments, the capping material 188a has a bottommost position lower than a topmost position of the dielectric cap 184. In some embodiments, the capping material 188a has a topmost position higher or lower than a topmost position of the dielectric cap 184. In some embodiments, the capping material 188a has a thicker thickness than the dielectric cap 184. In some embodiments, the capping material 188a has a thickness greater than or less than a thickness of the dielectric cap 184. In some embodiments, the capping material 188a near the outermost sidewall of the dielectric cap 184 may have a thicker thickness than away from the outermost sidewall of the dielectric cap 184.

Figure 22:
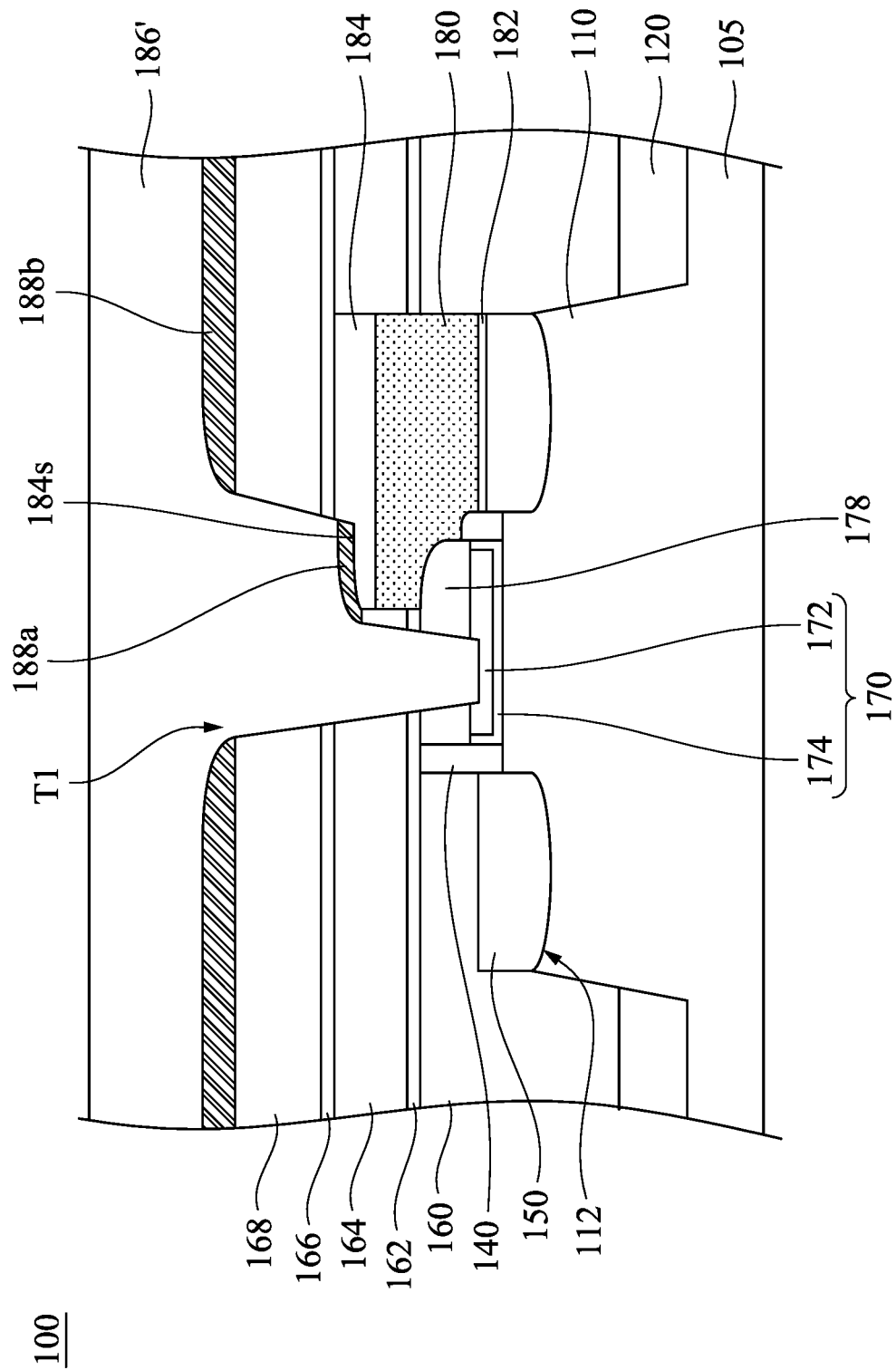

Referring back to FIG. 2B, the method M then proceeds to block S119 where a conductive material is deposited over the substrate to fill in the gate contact opening. With reference to FIG. 22, in some embodiments of block S119, a conductive material 186' is deposited over the substrate 105 and fills in the gate contact opening Ti. The conductive material 186 includes, for example, cobalt, tungsten, ruthenium or other suitable metals. In some embodiments, the method of forming the conductive material 186' may include CVD, PVD, ALD, or other suitable processes.

Referring back to FIG. 2B, the method M then proceeds to block S120 where a chemical mechanical polishing process is performed on the conductive material to remove the excess portions of the conductive material to form gate contact in the gate contact opening and landing on the replacement gate structure. With reference to FIG. 23, in some embodiments of block S120, the capping material 188b (see FIG. 22) and the excess portions of the conductive material 186' (see FIG. 22) are removed, either through etching, a planarization process such as chemical mechanical polish (CMP), or the like, forming the upper surface of the metal-filled opening substantially coplanar with a top surface of the ILD layer 168. The remaining portions of the conductive material 186' (see FIG. 22) in the gate contact opening T1 forms the gate contact 186. The gate contact 186 has a stepped sidewall structure 186s having an upper sidewall 186a, a lower sidewall 186b laterally set back from the upper sidewall 186a, and an intermediary surface 186c connecting the upper sidewall 186a to the lower sidewall 186b. As shown in FIG. 23, the capping material 188a is sandwiched between the intermediary surface 186c of the gate contact 186 and the dielectric cap 184. Therefore, the capping material 188a is formed to increase a distance between the source/drain contact 180 and the gate contact 186, which in turn prevents a leakage current from flowing between the source/drain contact 180 and the gate contact 186, and thus the yield of the semiconductor device 100 can be improved.

Figure 24:
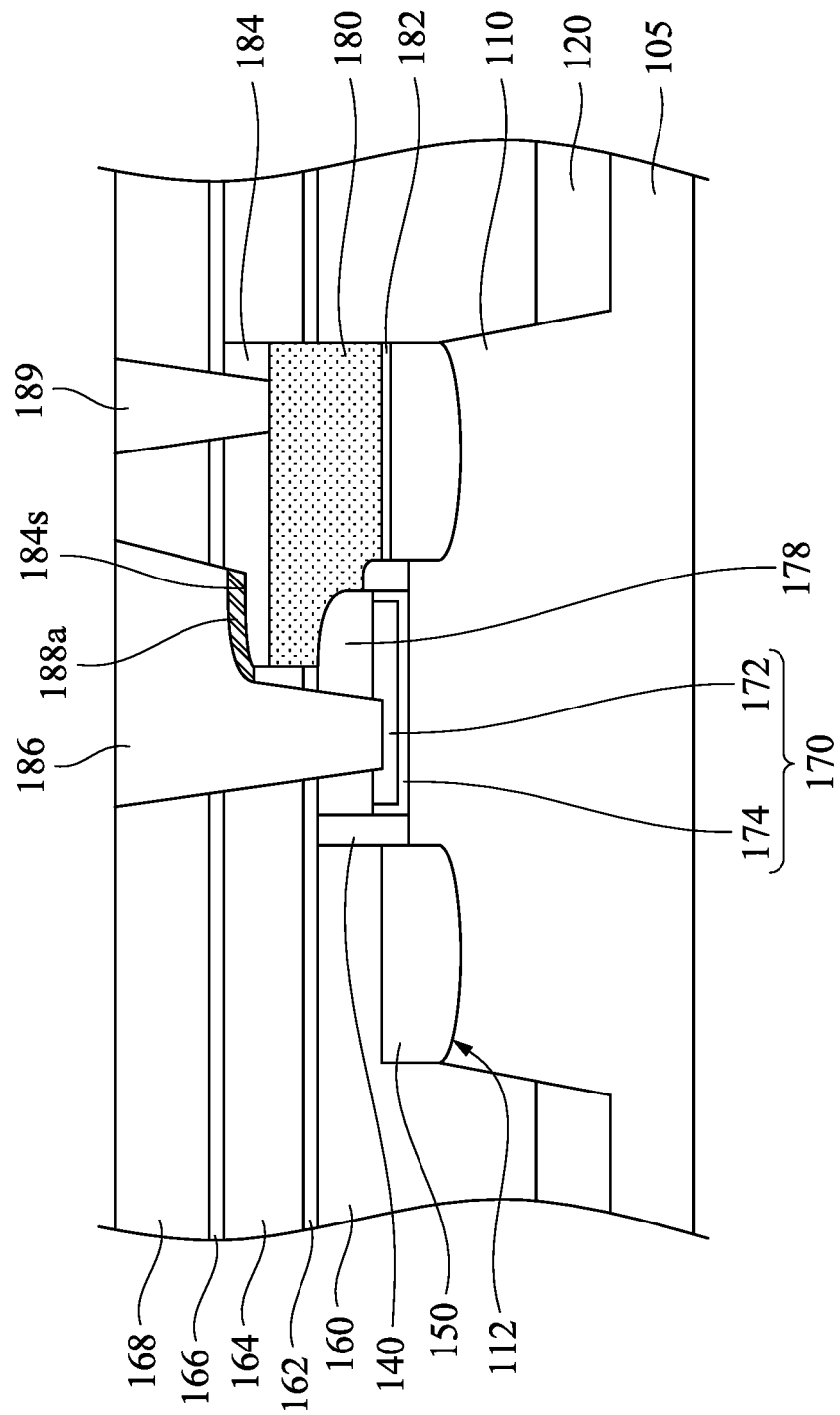

Referring back to FIG. 2B, the method M then proceeds to block S121 where a source/drain via is formed to land on the source/drain contact. With reference to FIG. 24, in some embodiments of block S121, a source/drain via 189 is formed through the ILD layers 164 and 168 and CESL 166 to land on the source/drain contact 180. In some embodiments, the source/drain via 189 may include a low resistivity conductor material selected from the group of conductor materials including, but not limited to, copper and copper-based alloy. Alternatively, the source/drain via 189 may include various materials, such as cobalt, tungsten, ruthenium, aluminum, gold, silver, another suitable conductive material, or combinations thereof. In some embodiments, the source/drain via 189 may be a copper-containing layer formed over the copper seed layer. In some embodiments, the method of forming the source/drain via 189 may include CVD, PVD, ALD, or other suitable processes. In some embodiments, the method may further include forming a butted contact to connect a gate and a source/drain contact of another transistor over the substrate 105. Subsequently, an interconnect structure may be formed over the substrate 105. The interconnect structure may include a plurality of metallization layers with multiple metallization vias or interconnects. Subsequently, a passivation layer may be deposited over the interconnect structure to form an integrated structure.

Based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a selective deposition process for forming a capping material over the thinned dielectric cap that is exposed in the gate contact opening. An advantage is that the capping material atop the thinned dielectric cap may be formed to increase a distance between the source/drain contact and the gate contact formed in the gate contact opening, which in turn prevents a leakage current from flowing between the source/drain contact and the gate contact, and thus the yield of the semiconductor device can be improved.

In some embodiments, the method forming a semiconductor device incudes forming a gate structure over a substrate; forming a plurality of source/drain structures in the substrate and on opposite sides of the gate structure; forming a source/drain contact on one of the plurality of source/drain structures; etching back the source/drain contact; forming a protective structure over the etched back source/drain contact; forming a dielectric layer over the gate structure and the protective structure; etching the dielectric layer to form an opening that exposes the gate structure and the protective structure; selectively depositing a capping material on the protective structure; after selectively depositing the capping material, forming a gate contact in the opening. In some embodiments, selectively depositing the capping material is performed by using a plasma process. In some embodiments, the capping material is selectively deposited using a deposition process that deposits the capping material on a top surface of the dielectric layer at a faster deposition rate than on a bottom surface of the opening. In some embodiments, selectively depositing the capping material is performed using a chlorine-containing gas. In some embodiments, the chlorine-containing gas is silicon tetrachloride gas. In some embodiments, selectively depositing the capping material is performed using a fluorocarbon gas. In some embodiments, selectively depositing the capping material is performed by a deposition process that deposits the capping material on the protective structure at a faster deposition rate than on the dielectric layer. In some embodiments, the capping material is made of a boron-based material. In some embodiments, the protective structure is made of silicon carbide. In some embodiments, the protective structure is made of silicon nitride and the dielectric layer is made of silicon oxide.

In some embodiments, the method forming a semiconductor device incudes forming a semiconductor fin extending upwardly from a substrate; forming a gate stack extending across the semiconductor fin; forming a plurality of epitaxial structures in the semiconductor fin and on opposite sides of the gate stack; forming a contact on one of the plurality of epitaxial structures and having an upper portion overlapping the gate stack; forming a protective layer over the contact; depositing a dielectric layer over the gate stack and the protective layer; performing an etching process on the dielectric layer to form a gate contact opening exposing the gate stack, the etching process forms a notched corner in the protective layer; forming a leakage barrier localized to the notched corner in the protective layer; forming a gate contact in the gate contact opening and over the leakage barrier. In some embodiments, the leakage barrier is formed using a selective deposition process. In some embodiments, the selective deposition process includes an inductively coupled plasma (ICP) process or a capacitively coupled plasma (CCP) process. In some embodiments, the leakage barrier is formed in-situ with the etching process of forming the gate contact opening. In some embodiments, the leakage barrier is formed ex-situ with the etching process of forming the gate contact opening.

In some embodiments, the semiconductor device includes a substrate, a nanostructured pedestal, a gate strip, source/drain regions, a source/drain contact, a protective structure, a gate contact, and a leakage barrier. The nanostructured pedestal is on the substrate. The nanostructured pedestal has a top surface and opposite side surfaces. The gate strip wraps around the top surface and the opposite side surfaces of the nanostructured pedestal. The source/drain regions are in the nanostructured pedestal and on opposite sides of the gate strip. The source/drain contact is on one of the source/drain regions. The protective structure is over the source/drain contact. The gate contact is on the gate strip. The gate contact has a stepped sidewall structure having an upper sidewall, a lower sidewall laterally set back from the upper sidewall, and an intermediary surface connecting the upper sidewall to the lower sidewall. The leakage barrier is between the intermediary surface of the stepped sidewall structure of the gate contact and the protective structure. In some embodiments, the leakage barrier comprises boron, boron nitride, boron carbide, fluorocarbon, or combinations thereof. In some embodiments, the leakage barrier is separated from the source/drain contact. In some embodiments, a bottommost position of the leakage barrier is higher than a top surface of the source/drain contact. In some embodiments, the protective structure has a notched corner, and the leakage barrier is inlaid in the notched corner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
    forming a gate structure over a substrate;
    forming a plurality of source/drain structures in the substrate and on opposite sides of the gate structure;
    forming a source/drain contact on one of the plurality of source/drain structures;
    etching back the source/drain contact;
    forming a protective structure over the etched back source/drain contact;
    forming a dielectric layer over the gate structure and the protective structure;
    etching the dielectric layer to form an opening that exposes the gate structure and the protective structure;
    selectively depositing a capping material on the protective structure; and
    after selectively depositing the capping material, forming a gate contact in the opening.

2. The method of claim 1, wherein selectively depositing the capping material is performed by using a plasma process.

3. The method of claim 1, wherein the capping material is selectively deposited using a deposition process that deposits the capping material on a top surface of the dielectric layer at a faster deposition rate than on a bottom surface of the opening.

4. The method of claim 1, wherein selectively depositing the capping material is performed using a chlorine-containing gas.

5. The method of claim 4, wherein the chlorine-containing gas is silicon tetrachloride gas.

6. The method of claim 1, wherein selectively depositing the capping material is performed using a fluorocarbon gas.

7. The method of claim 1, wherein selectively depositing the capping material is performed by a deposition process that deposits the capping material on the protective structure at a faster deposition rate than on the dielectric layer.

8. The method of claim 1, wherein the capping material is made of a boron-based material.

9. The method of claim 1, wherein the protective structure is made of silicon carbide.

10. The method of claim 1, wherein the protective structure is made of silicon nitride and the dielectric layer is made of silicon oxide.

11. A method for forming a semiconductor device, comprising:
    forming a semiconductor fin extending upwardly from a substrate;
    forming a gate stack extending across the semiconductor fin;
    forming a plurality of epitaxial structures in the semiconductor fin and on opposite sides of the gate stack;

forming a contact on one of the plurality of epitaxial structures and having an upper portion overlapping the gate stack;

forming a protective layer over the contact;

depositing a dielectric layer over the gate stack and the protective layer;

performing an etching process on the dielectric layer to form a gate contact opening exposing the gate stack, the etching process forms a notched corner in the protective layer;

forming a leakage barrier localized to the notched corner in the protective layer; and forming a gate contact in the gate contact opening and over the leakage barrier.

12. The method of claim 11, wherein the leakage barrier is formed using a selective deposition process.

13. The method of claim 12, wherein the selective deposition process includes an inductively coupled plasma (ICP) process or a capacitively coupled plasma (CCP) process.

14. The method of claim 11, wherein the leakage barrier is formed in-situ with the etching process of forming the gate contact opening.

15. The method of claim 11, wherein the leakage barrier is formed ex-situ with the etching process of forming the gate contact opening.

16. A method for forming a semiconductor device, comprising:

forming a nanostructured pedestal on a substrate, wherein the nanostructured pedestal has a top surface and opposite side surfaces;

forming source/drain regions in the nanostructured pedestal;

forming a gate strip wrapping around the top surface and the opposite side surfaces of the nanostructured pedestal and between the source/drain regions;

forming a source/drain contact on one of the source/drain regions;

forming a protective structure over the source/drain contact;

forming a leakage barrier over the protective structure; and forming a gate contact on the gate strip, wherein the gate contact has a stepped sidewall structure having an upper sidewall, a lower sidewall laterally set back from the upper sidewall, and an intermediary surface connecting the upper sidewall to the lower sidewall, and the leakage barrier is between the intermediary surface of the stepped sidewall structure of the gate contact and the protective structure.

17. The method of claim 16, wherein the leakage barrier comprises boron, boron nitride, boron carbide, fluorocarbon, or combinations thereof.

18. The method of claim 16, wherein the leakage barrier is separated from the source/drain contact.

19. The method of claim 16, wherein a bottommost position of the leakage barrier is higher than a top surface of the source/drain contact.

20. The method of claim 16, wherein the protective structure has a notched corner, and the leakage barrier is inlaid in the notched corner.

* * * * *